United States Patent
Uno et al.

(10) Patent No.: US 9,331,049 B2
(45) Date of Patent: May 3, 2016

(54) BONDING STRUCTURE OF BONDING WIRE

(75) Inventors: Tomohiro Uno, Tokyo (JP); Takashi Yamada, Iruma (JP); Atsuo Ikeda, Iruma (JP)

(73) Assignee: NIPPON STEEL & SUMIKIN MATERIALS CO., LTD., Tokyo (JP)

( * ) Notice: Subject to any disclaimer, the term of this patent is extended or adjusted under 35 U.S.C. 154(b) by 589 days.

(21) Appl. No.: 12/866,797

(22) PCT Filed: Jul. 10, 2009

(86) PCT No.: PCT/JP2009/062635
§ 371 (c)(1),
(2), (4) Date: Oct. 21, 2010

(87) PCT Pub. No.: WO2010/005086
PCT Pub. Date: Jan. 14, 2010

(65) Prior Publication Data
US 2011/0104510 A1    May 5, 2011

(30) Foreign Application Priority Data

Jul. 11, 2008   (JP) .................................. 2008-181813

(51) Int. Cl.
*H01L 23/48*   (2006.01)
*H01L 23/00*   (2006.01)

(52) U.S. Cl.
CPC ................. *H01L 24/85* (2013.01); *H01L 24/05* (2013.01); *H01L 24/43* (2013.01); *H01L 24/45* (2013.01);
(Continued)

(58) Field of Classification Search
CPC ......... H01L 24/05; H01L 24/43; H01L 24/45; B23K 20/004
USPC ................. 257/700, 738, 784, 675, 741–777; 438/200, 106
See application file for complete search history.

(56) References Cited

U.S. PATENT DOCUMENTS

| 7,038,305 | B1* | 5/2006 | Chet et al. ...................... 257/675 |
| 2002/0011657 | A1* | 1/2002 | Saito ............................ 257/700 |

(Continued)

FOREIGN PATENT DOCUMENTS

| JP | 61-99645 A | 5/1986 |
| JP | 62-97360 A | 5/1987 |

(Continued)

OTHER PUBLICATIONS

S. Wolf and R. Tauber, Silicon Processing for the VLSI Era, vol. 1, Process Technology, 1986 by Lattice Press, Chapter 8: Diffusion in Silicon, pp. 242-251.*

*Primary Examiner* — Jerome Jackson, Jr.
*Assistant Examiner* — Fang-Xing Jiang
(74) *Attorney, Agent, or Firm* — Troutman Sanders LLP

(57) ABSTRACT

The invention is aimed at providing a bonding structure of a copper-based bonding wire, realizing low material cost, high productivity in a continuous bonding in reverse bonding for wedge bonding on bumps, as well as excellent reliability in high-temperature heating, thermal cycle test, reflow test, HAST test or the like. The bonding structure is for connecting the bonding wire onto a ball bump formed on an electrode of a semiconductor device, the bonding wire and the ball bump respectively containing copper as a major component thereof. The bonding structure comprises a concentrated layer A provided at an interface of a bonding part of the ball bump and the bonding wire, wherein the concentration of a metal R other than copper in the concentrated layer A is not less than ten times the average concentration of the metal R in the ball bump; and a concentrated layer B provided at an interface of a bonding part of the ball bump and the electrode, wherein the concentration of the metal R in the concentrated layer B is not less than ten times the average concentration of the metal R in the ball bump.

15 Claims, 3 Drawing Sheets

(52) U.S. Cl.
CPC ....... *H01L 24/48* (2013.01); *H01L 2224/04042* (2013.01); *H01L 2224/05556* (2013.01); *H01L 2224/05624* (2013.01); *H01L 2224/05639* (2013.01); *H01L 2224/05644* (2013.01); *H01L 2224/05647* (2013.01); *H01L 2224/05664* (2013.01); *H01L 2224/4312* (2013.01); *H01L 2224/4321* (2013.01); *H01L 2224/4382* (2013.01); *H01L 2224/43825* (2013.01); *H01L 2224/43826* (2013.01); *H01L 2224/43827* (2013.01); *H01L 2224/43848* (2013.01); *H01L 2224/45015* (2013.01); *H01L 2224/4554* (2013.01); *H01L 2224/45124* (2013.01); *H01L 2224/45144* (2013.01); *H01L 2224/45147* (2013.01); *H01L 2224/45565* (2013.01); *H01L 2224/45572* (2013.01); *H01L 2224/45639* (2013.01); *H01L 2224/45644* (2013.01); *H01L 2224/45664* (2013.01); *H01L 2224/45669* (2013.01); *H01L 2224/45673* (2013.01); *H01L 2224/45676* (2013.01); *H01L 2224/48011* (2013.01); *H01L 2224/4847* (2013.01); *H01L 2224/48091* (2013.01); *H01L 2224/48471* (2013.01); *H01L 2224/48475* (2013.01); *H01L 2224/48486* (2013.01); *H01L 2224/48499* (2013.01); *H01L 2224/48507* (2013.01); *H01L 2224/48511* (2013.01); *H01L 2224/48624* (2013.01); *H01L 2224/48639* (2013.01); *H01L 2224/48644* (2013.01); *H01L 2224/48647* (2013.01); *H01L 2224/48664* (2013.01); *H01L 2224/48699* (2013.01); *H01L 2224/48724* (2013.01); *H01L 2224/48739* (2013.01); *H01L 2224/48744* (2013.01); *H01L 2224/48747* (2013.01); *H01L 2224/48764* (2013.01); *H01L 2224/48839* (2013.01); *H01L 2224/48844* (2013.01); *H01L 2224/48847* (2013.01); *H01L 2224/48864* (2013.01); *H01L 2224/78301* (2013.01); *H01L 2224/85045* (2013.01); *H01L 2224/85051* (2013.01); *H01L 2224/85065* (2013.01); *H01L 2224/85075* (2013.01); *H01L 2224/85186* (2013.01); *H01L 2224/85205* (2013.01); *H01L 2224/85207* (2013.01); *H01L 2224/85439* (2013.01); *H01L 2224/85444* (2013.01); *H01L 2224/85986* (2013.01); *H01L 2225/06562* (2013.01); *H01L 2924/0104* (2013.01); *H01L 2924/01004* (2013.01); *H01L 2924/01005* (2013.01); *H01L 2924/01006* (2013.01); *H01L 2924/01007* (2013.01); *H01L 2924/01013* (2013.01); *H01L 2924/01014* (2013.01); *H01L 2924/01015* (2013.01); *H01L 2924/01018* (2013.01); *H01L 2924/01022* (2013.01); *H01L 2924/01024* (2013.01); *H01L 2924/01027* (2013.01); *H01L 2924/01028* (2013.01); *H01L 2924/01029* (2013.01); *H01L 2924/01033* (2013.01); *H01L 2924/01044* (2013.01); *H01L 2924/01045* (2013.01); *H01L 2924/01046* (2013.01); *H01L 2924/01047* (2013.01); *H01L 2924/01057* (2013.01); *H01L 2924/01077* (2013.01); *H01L 2924/01078* (2013.01); *H01L 2924/01079* (2013.01); *H01L 2924/01082* (2013.01); *H01L 2924/01083* (2013.01); *H01L 2924/01105* (2013.01); *H01L 2924/01204* (2013.01); *H01L 2924/01205* (2013.01); *H01L 2924/01206* (2013.01); *H01L 2924/01327* (2013.01); *H01L 2924/10253* (2013.01); *H01L 2924/14* (2013.01); *H01L 2924/15311* (2013.01); *H01L 2924/20751* (2013.01); *H01L 2924/20752* (2013.01); *H01L 2924/20753* (2013.01); *H01L 2924/20754* (2013.01); *H01L 2924/20755* (2013.01); *H01L 2924/20756* (2013.01); *H01L 2924/20757* (2013.01); *H01L 2924/3025* (2013.01); *H01L 2924/351* (2013.01); *Y10T 428/12222* (2015.01)

(56) References Cited

U.S. PATENT DOCUMENTS

| | | | | |
|---|---|---|---|---|
| 2003/0049882 A1* | 3/2003 | Yin et al. | | 438/106 |
| 2003/0222352 A1* | 12/2003 | Kung et al. | | 257/772 |
| 2004/0072396 A1* | 4/2004 | Tiziani et al. | | 438/200 |
| 2005/0151253 A1* | 7/2005 | Nonaka et al. | | 257/741 |
| 2006/0049528 A1* | 3/2006 | Kang et al. | | 257/777 |
| 2007/0222087 A1* | 9/2007 | Lee et al. | | 257/784 |
| 2009/0188696 A1* | 7/2009 | Uno | B23K 20/004 | 174/126.2 |
| 2010/0213619 A1* | 8/2010 | Uno | H01L 24/45 | 257/780 |
| 2010/0264534 A1* | 10/2010 | Wu | H01L 24/45 | 257/692 |
| 2012/0104613 A1* | 5/2012 | Uno | H01L 24/43 | 257/751 |

FOREIGN PATENT DOCUMENTS

| | | |
|---|---|---|
| JP | 63-24660 A | 2/1988 |
| JP | 2005-86200 A | 3/2005 |
| JP | 2005-259915 A | 9/2005 |
| JP | 2006-216929 A | 8/2006 |
| JP | 2007-12776 A | 1/2007 |

* cited by examiner

BONDING STRUCTURE OF BONDING WIRE

CROSS REFERENCE TO PRIOR APPLICATIONS

This application is a U.S. National Phase application under 35U.S.C. § 371of International Application No. PCT/JP2009/062635, filed on Jul. 10, 2009and claims benefit of priority to Japanese Patent Application No. 2008-181813, filed on Jul 11, 2008. The International Application was published in Japanese on Jan. 14, 2010as WO 2010/005086under PCT Article 21(2). All these applications are herein incorporated by reference.

TECHNICAL FIELD

The present invention relates to a bonding structure of a bonding wire used to connect electrodes on a semiconductor device by wiring them with circuit wiring substrates such as lead frames, substrates and tapes.

BACKGROUND ART

At present, a thin wire (bonding wire) having a wire diameter of about 20 to 50 μm is used mainly as the bonding wire bonding electrodes on a semiconductor device with external terminals. In order to bond the bonding wire, the ultrasonic wave-combined thermocompression bonding system is generally used and, general-purpose bonding apparatuses or capillary jigs used by passing the bonding wire through the inside thereof to connect are used. The end of the wire is melted by heating using an arc heat input to form a ball by utilizing a surface tension. Then, this ball part is press-bonded onto the electrode of the semiconductor device heated at a temperature in a range from 150 to 300° C., and then the bonding wire is directly bonded to the external lead side by the ultrasonic compression bonding. As mentioned above, this system bonds the ball parts to the electrode on such an IC chip to wedge-bond the bonding wire on electrodes of a lead frame and a substrate, and is called a forward bonding system.

In recent years, as to a packaging structure of a semiconductor, in addition to the current QFP (Quad Flat Packaging) using a lead frame, new structures such as BGA (Ball Grid Array) and CSP (Chip Scale Packaging) using a substrate and a polyimide tape have been put to practical use. There is therefore a demand for the bonding wire having better looping, bonding ability and mass-productivity.

Materials which are the subjects to be bonded of the bonding wire have been diversified, and in addition to conventional Al alloys, Cu suitable for the thinner wiring has been put to practical use for wiring on a silicon substrate and materials for electrodes. Also, there are many cases where the lead frame is plated with Ag, Pd or the like, and, Cu wiring is provided on a resin substrate and tapes or the like, and a film of a noble metal element such as gold or its alloy is formed on the wiring. It is required to improve the bonding ability and the reliability of the bonding part of the bonding wire corresponding to such various subjects to be bonded.

As the raw materials of the bonding wire, a high-purity 4N type (purity>99.99 mass %) gold has been primarily used so far. However, it is desired to use other types of metal with lower material cost for the bonding wire because gold is expensive.

The bonding wire using copper as its raw material is developed because it needs to be lower in material cost, excellent in electroconductivity and improved in, for example, ball bonding and wedge bonding, and which is disclosed in Patent Document 1 or the like. The connection of the copper-based bonding wire is characterized by the feature that when the ball part of the bonding is formed with blowing a nitrogen gas or a hydrogen-containing nitrogen gas to the end of the bonding wire to inhibit oxidation. At present, a nitrogen gas containing 5% of hydrogen is generally used as an atmospheric gas when forming the ball of the copper-based bonding wire. Patent Document 2 discloses that a copper wire is connected with a copper or copper alloy lead frame in a 5% $H_2+N_2$ atmosphere. Also, non-Patent Document 1 reveals that the 5% $H_2+N_2$ gas is more desirable than an $N_2$ gas in the formation of the ball of the copper bonding wire because the 5% $H_2+N_2$ gas can inhibit oxidation of the surface of the ball.

The performance of the copper bonding wire is deteriorated by oxidation of the surface of the wire, and therefore a shorter storage life is concerned. In light of this, Patent Document 3 proposes the bonding wire obtained by coating copper with a noble metal or an anticorrosive metal such as gold, silver, platinum, palladium, nickel, cobalt, chromium or titanium as a method of preventing oxidation of the surface of the copper bonding wire.

The practical use of this copper-based bonding wire has been started in applications such as a power ICs using a large diameter having a wire diameter of about 50 μm. Moreover, in applications such as LSIs using thinner wires having a wire diameter of 25 μm or less, though the evaluation of the wire has been started, the copper-based bonding wire has not been put to practical use.

It is necessary that this copper-based bonding wire be adapted to various packaging structures for a wide prevalence in the fields of LSIs. It is necessary that this copper-based bonding wire can be adapted not only to conventional monolayer structures including only one semiconductor device, but also to, for example, laminate structures (stacked Chip) in which the plurality of semiconductor devices are vertically stacked, and multi-chip structures in which the plurality of chips are horizontally arranged. In memory LSI applications such as flash memories, many laminate structures are used. Therefore, the number of chips is increased to a level of five or more stacks, or special laminate structures such as an overhang structure having a difficulty in wire bonding are used. This leads to demand stricter requirements for wire connection. The laminate structure needs a specific connection called a reverse bonding, and it is therefore desired to develop reverse bonding technologies using the copper-based bonding wire.

The reverse bonding connection is a method for wedge bonding the bonding wire to the electrode on the IC chip by bonding the ball part onto the electrode of the lead frame and the substrate, which has a reverse positional relationship with the bonding of the above mentioned forward bonding method. In the reverse bonding connection, it is difficult to wedge-bond the bonding wire directly to the electrodes made of an aluminum film on the IC chip and therefore, a bonding using a stud bump made to be interposed between the bonding wire and the electrode is adopted. The ball part formed at the end of the bonding wire is bonded onto the surface of the electrode (hereinafter, referred to as electrode/bump bonding), and then, the bonding wire is cut to form a stud bump. In the course of the subsequent reverse bonding, the ball part formed at the end of the wire is bonded onto the electrode on the lead or the substrate and a loop is formed while moving the capillary from the lead side to the chip side. Then, the bonding wire is wedge-bonded onto the stud bump (hereinafter, referred to as bump/wedge bonding). This wedge bonding to the bump is advantageous in many points such as bonding strength, mass-production bonding ability and reliability. In the reverse bonding, there is a risk of occurring defects than in the case of the forward bonding because two bonding operations, the electrode/bump bonding and the bump/wedge bonding are carried out.

In this specification, a connecting system in which the bonding wire is wedge-bonded to a bump is defined as a reverse bonding. In the cases where chips are directly connected with each other by the bonding wire in the multi-chip structure, the bump/wedge bonding is commonly utilized. Although the positional relationship of bonding is not necessarily in a reverse direction, this case also falls under the category of the reverse bonding.

Patent Document 3 discloses that a gold wire, aluminum wire or copper wire is used as a material for the bonding wire in a connecting method similar to the reverse bonding connection. The connection method disclosed in this document is slightly different from the ordinary reverse bonding connection, which has a technique for stitch-bonding the bonding wire (same as "wedge-bonding") without forming the ball in the connection to the lead side to minimize the time required for the wire bonding. Although it is described in Claims that gold and copper can be used as the raw material for the wire, there is no description concerning a difference between gold and copper, or descriptions of examples. There has actually been no substantial report concerning practical use of the copper-based bonding wire in the reverse bonding so far.

At present, only the gold bonding wire is used in the mass-production. Because a gold/gold bonding structure is formed in the bump/wedge bonding using the gold bonding wire, it is easy to obtain better bonding ability and good bonding strength. However, there is a fear that, as is evident from the fact that no copper-based bonding wire has been used for the reverse bonding, it may be difficult to practically use the bump/wedge bonding using the copper-based bonding wire. In order to use the copper-based bonding wire in applications of memory LSIs and multi-tip packagings, it is desired to improve, for example, the mass-productivity, bonding strength and reliability of the reverse bonding.

Patent Document 1: Japanese Unexamined Patent Application Publication No. 61-99645

Patent Document 2: Japanese Unexamined Patent Application Publication No. 63-24660

Patent Document 3: Japanese Unexamined Patent Application Publication No. 62-97360

Patent Document 4: Japanese Unexamined Patent Application Publication No. 2005-86200

DISCLOSURE OF THE INVENTION

Problems to be Solved by the Invention

Forward bonding connection using the thick wire is the mainstream in the practical use of the copper-based bonding wire and in the evaluation of the mass-production thereof. There is almost no report concerning the reverse bonding connection using the thin wire, nor has it been clarified so far what technical problems arise in association with the mass-production by the reverse bonding using the thin wire.

The inventors of the present invention have made the evaluation of the reverse bonding connection using the copper-based bonding wire, and found that the problems may be classified into those concerning a bonding ability, a bonding reliability and a loop shape. Metal bonding in the reverse bonding connection is made at two positions, that is, an electrode/bump bonding part where a stud bump is connected to the electrode on a semiconductor device and a bump/wedge bonding part where a bonding wire is wedge-bonded to the stud bump. Both bonding parts are different from each other in the characteristics required and the problems. Particularly, it is very difficult to improve the bump/wedge bonding ability by using a conventional copper-based bonding wire.

It is difficult to obtain sufficient bonding strength by the bump/wedge bonding using the copper-based bonding wire because this bonding has a copper/copper bonding structure, posing the problems that the defects such as peeling of the bonding part or breakage of the bonding wire occur during the course of continuous bonding operations. If the load and the ultrasonic vibration in the wedge bonding are increased to increase the bonding strength, this poses the problem that the bonding wire is excessively deformed and is eventually broken at a part close to the bump/wedge bonding part. If the load and the ultrasonic vibration are decreased on the contrary, peeling occurs at the interface of the bump/wedge bonding part. In the case of the gold bonding wire, the appropriate range of the condition for gold/gold bonding is wide, and therefore such a defect in the bump/wedge bonding part can be improved relatively easily. However, in the case of the copper-based bonding wire, the appropriate range of the condition for bonding is extremely narrow, and it is therefore difficult to improve the problems concerning peeling of the bonding part and wire breakage at the same time by a mere extension of the conventional bonding conditions that the load and the ultrasound wave are controlled. It is necessary to enhance the copper/copper bonding strength to improve the bump/wedge bonding in the continuous bonding operations.

Moreover, as a cause of the reduction in the productivity of the bump/wedge bonding using the copper-based bonding wire, it has been confirmed that oxidation of copper, which progresses on the surface of the bump while the stud bump is heated on the bonding stage in the continuous bonding operations, which accelerates the reduction in the strength of the wedge bonding. In the evaluation of the bonding strength in the bump/wedge bonding in this context, the pull test is simple and effective, and it is preferred to carry out the second pull test in which a part close to the bump is hooked to pull up. It is difficult to sufficiently destroy a copper oxide formed on the surface of the stud bump having a complicated shape by the load and the ultrasonic vibration in the wedge bonding, which causes the copper oxide to continuously remain at the interface of the bump/wedge bonding part, leading to the reduction in bonding strength. Although the surface oxidation of the stud bump can be reduced to some extent by using a method in which an inert gas is blown to an area to be wire-bonded on the stage, it is difficult to obtain a completely shield condition because of its operability. It is difficult to control the amount of the copper oxide remaining at the interface of the bump/wedge bonding part only by an extension of known conventional techniques such as utilization of a bonder device for the conventional gold bonding wire or improving the gas shield for the copper-based bonding wire. It is a phenomenon specific to the reverse bonding of the copper-based bonding wire that oxidation of such a wire bonding part progresses during the course of bonding process, which reduces the productivity. This phenomenon hardly gives a problem in the forward bonding of the conventional gold bonding wire or the copper-based bonding wire, which has been put into practical use so far.

In the bump/wedge bonding part of the copper-based bonding wire, there is also the case where a problem arises as to a bonding reliability during use. It has been therefore confirmed that a breakage of the bonding wire or the bonding part occur in the vicinity of the bump/wedge bonding part in a typical reliability tests including a TOT test (Temperature Cycling Test) made by a cyclic heat treatment, a reflow test for evaluating a durability to a heat impact by raising the temperature rapidly in a short time, a PCT test (Pressure Cooker Test) performed by heating in a high-temperature and high-humidity environment and a high-temperature and high-humidity bias test (HAST: Highly Accelerated Temperature and humidity Stress Test) performed by applying an electric bias in a high-temperature and high-humidity environment. In these reliability tests, the percentage defective is further increased in the reverse bonding of the copper-based bonding wire than in the forward bonding or the reverse bonding of gold, posing a problem.

There is a slight difference between the TCT test and the reflow test in the performance required for the bump/wedge bonding part. The TCT test is an evaluation method in which a heat cycle in a temperature range from −40 to 150° C. is repeated several hundred times or more to gradually induce defects. In the reflow test, on the other hand, durability to a heat impact is evaluated by raising the temperature rapidly in a short time such as a few minutes.

In the PCT test, the occurrence of defects is accelerated by the synergistic effect of the high temperature (121 to 130° C.) and the high humidity (85 to 100% RH). The defectives occur mainly at the bump/wedge bonding part. This is considered attributable to the fact that water is diffused up to the interface of the bump/wedge bonding part to deteriorate the bonding strength by water, ions and the like.

In the HAST test, defects are accelerated by both of the effects of a high-temperature/high-humidity and an electric bias. It is often adopted where the reliability is more severely evaluated by applying an electric bias than by the above PCT test. Although major defectives occur mainly at the electrode/bump bonding part, only a part of defectives occur also at the bump/wedge bonding part. It is considered that water, ion and the like accelerate the deterioration of the bonding strength by the diffusion of water up to the interface of the bonding part and the transfer of ions generated from the resin to the bonding part being promoted by the electric bias.

It is considered that one of the reasons of the defects causing a decrease in the reliability of the bonding part is possibly the phenomenon specific to the reverse bonding of the copper-based bonding wire. Because the stud bump originally has a complicated shape, clearances not bonded with the interface of the bump/wedge bonding part are easily produced. However, the gold bonding wire is hardly deteriorated in long-term reliability even if a few clearances are produced. The inventors of the present invention have confirmed that in the case of using the copper-based bonding wire, on the contrary, oxidation of copper at the interface of the bonding part is progressed by ambient air, water or the like if clearances exist, so that the bonding part is deteriorated during use. In the current wire bonding techniques, though the clearances at the interface of the bonding part can be reduced to a certain extent by a load, ultrasonic wave or the like, it is difficult to completely remove the clearances. The dispersion at the interface is inhibited by the intervention of the aforementioned copper oxide of the bump surface at the interface of the bump/wedge bonding part, which is also a cause of reduction in bonding strength by a heat cycle or a heat impact.

The problems posed on the electrode/bump bonding are to improve a bonding strength without giving any damage to a chip, to stabilize the shape of the stud bump and to improve a long-term reliability in a high-temperature heating test. As for the chip damages, the shape of the bump and the high-temperature reliability, the reverse bonding system involves partly common problems with those posed on the ball bonding made by the conventional forward bonding system using the copper-based bonding wire, but a stricter improvement in quality is required in the reverse bonding system. This is because in the ball bonding of the forward bonding, the ball part is deformed only once by applying a load such as an impact load, a weight load and ultrasonic vibration, whereas in the reverse bonding, deformation of the ball is excessively progressed, because grounding impact, weight load and ultrasonic vibration are applied twice, i.e., at the formation of the stud bump and at the wedge bonding on the bump, posing problems concerning chip damages, larger bump size, drop in shear strength in the initial bump bonding and decrease in high-temperature reliability. As the raw material of the electrode, for example, aluminum, aluminum alloys (for example, Al—Si and Al—Si—Cu), palladium and palladium alloys/Ni/Cu are utilized. It has been, however, confirmed that the aforementioned problems concerning the electrode/bump bonding of copper-based bonding wire likewise arise regardless of any electrode materials.

With regard to the loop shape, it is difficult to stably control it in the reverse bonding of the copper-based bonding wire. In an ordinary forward bonding, it is relatively easy to stabilize the loop shape of the copper bonding wire and therefore, this bonding hardly poses a problem as in the case of the gold bonding wire. On the other hand, the reason why the loop shape is distorted in the reverse bonding is because the bonding wire has to be wedge-bonded onto the bump having large irregularities in the bump/wedge bonding. This leads to an increase in the frequency of occurrence of abnormal loop shapes such as loops leaned rightward or leftward or loops hung downward. It is considered that the distortions of the loop shape are promoted by ultrasonic vibration. However, in the reverse bonding connection of the gold bonding wire, the loop shape can be improved by reducing the ultrasonic vibration in the wedge bonding. This is based on the fact that because the bump/wedge bonding constitutes a gold/gold structure, it is easy to enhance bonding strength and thereby enabling to significantly reduce or remove the ultrasonic vibration. In the copper-based bonding wire, on the other hand, a copper oxide film formed on the surface of the wire is a large cause of reduction in bonding ability in the bump/wedge bonding and it is therefore necessary to further increase the ultrasonic vibration for the wedge bonding than in the case of the gold bonding wire to destroy this copper oxide film. Therefore, it is considered that the loop control of the reverse bonding is much more difficult in the copper-based bonding wire than in the gold bonding wire. For the stabilization of the loop shape of the reverse bonding of the copper-based bonding wire, it is effective to inhibit oxidation of the surface of the wire. This effect of improvement can hardly be expected in the case of the gold bonding wire, but is expected to be effective in the case of the copper-based bonding wire.

In view of this situation, it is an object of the present invention to solve the above problems and to provide a bonding structure of the copper-based bonding wire excellent in bonding ability, bonding reliability and loop shape.

Means for Solving the Problems

The inventors of the present invention have made earnest studies as to a bonding structure suitable for the reverse bonding of the copper-based bonding wire to solve the above problems, and as a result, found that it is effective to form a concentrated layer having a high concentration of metals other than copper at the interface of the bonding part. What is more effective, the inventors have also found that it is effective to control the composition and the structure in the interface or the surface of the bonding part, and also it is effective to use copper-based bonding wire having a multilayer structure comprising an outer skin layer and a core material.

The present invention has been made based on the above findings, of which the structure is summarized as follows:

According to a first aspect of the present invention, there is provided a bonding structure of a bonding wire for connecting the bonding wire onto a ball bump formed on an electrode of a semiconductor device, the bonding wire and the ball bump respectively containing copper as a major component thereof, the bonding structure comprising: a concentrated layer A provided at an interface of a bonding part of the ball bump and the bonding wire, wherein the concentration of a metal R other than copper in the concentrated layer A is not less than ten times the average concentration of the metal R in the ball bump; and a concentrated layer B provided at an interface of a bonding part of the ball bump and the electrode, wherein the concentration of the metal R in the concentrated layer B is not less than ten times the average concentration of the metal R in the ball bump.

According to a second aspect of the present invention, there is provided the bonding structure of the bonding wire according to the first aspect, wherein, in the concentrated layer A, the thickness of a region in which the concentration of the metal R is 10 mol % or more is in a range from 0.01 to 5 µm.

According to a third aspect of the present invention, there is provided the bonding structure of the bonding wire according to the first or second aspect, wherein, in the concentrated layer A, the thickness of a region in which the concentration of the metal R is 50 mol % or more is in a range from 0.005 to 1 µm.

According to a fourth aspect of the present invention, there is provided the bonding structure of the bonding wire according to any one of the first to third aspects, wherein, in the concentrated layer B, the thickness of a region in which the concentration of the metal R is 3 mol % or more is in a range from 0.01 to 5 µm.

According to a fifth aspect of the present invention, there is provided the bonding structure of the bonding wire according to any one of the first to fourth aspects, wherein at least a part of the concentrated layer B is formed inside of at least one of a diffusion layer and an intermetallic compound, the diffusion layer and the intermetallic compound being each constituted primarily of major components of the electrode and copper.

According to a sixth aspect of the present invention, there is provided the bonding structure of the bonding wire according to any one of the first to fifth aspects, wherein the thickness of a region in which the concentration of the metal R in the concentrated layer A is 50 mol % or more is not less than three times that of a region in which the concentration of the metal R in the concentrated layer B is 50 mol % or more.

According to a seventh aspect of the present invention, there is provided the bonding structure of the bonding wire according to any one of the first to sixth aspects, the bonding structure further comprising a concentrated layer C formed in 40% or more of a surface area of the ball bump and in 30% or more of a surface area of the bonding wire connected onto the ball bump, wherein the concentration of the metal R in the concentrated layer C is not less than five times the average concentration of the metal R in the ball bump.

According to an eighth aspect of the present invention, there is provided a bonding structure of a bonding wire for connecting the bonding wire onto a ball bump formed on an electrode of a semiconductor device, the bonding wire and the ball bump respectively containing copper as a major component thereof, the bonding structure comprising:

a concentrated layer A provided at an interface of a bonding part of the ball bump and the bonding wire, wherein the concentration of a metal R other than copper in the concentrated layer A is not less than ten times the average concentration of the metal R in the ball bump; and a concentrated layer C formed in 40% or more of a surface area of the ball bump and in 30% or more of a surface area of the bonding wire connected onto the ball bump, wherein the concentration of the metal R in the concentrated layer C is not less than five times the average concentration of the metal R in the ball bump.

According to a ninth aspect of the present invention, there is provided the bonding structure of the bonding wire according to the eighth aspect, wherein, in the concentrated layer A, the thickness of a region in which the concentration of the metal R is 10 mol % or more is in a range from 0.01 to 5 µm.

According to a tenth aspect of the present invention, there is provided the bonding structure of the bonding wire according to the eighth or ninth aspect of the present invention, wherein, in the concentrated layer A, the thickness of a region in which the concentration of the metal R is 50 mol % or more is in a range from 0.005 to 1 µm.

According to an eleventh aspect of the present invention, there is provided the bonding structure of the bonding wire according to any one of the seventh to tenth aspect of the present invention, wherein, in the concentrated layer C on the surface of the bump, the thickness of a region in which the concentration of the metal R is 0.5 mol % or more is in a range from 0.05 to 20 µm.

According to a twelfth aspect of the present invention, there is provided the bonding structure of the bonding wire according to any one of the first to eleventh aspect of the present invention, wherein the metal R includes one or more elements selected from palladium, gold and platinum.

According to a thirteenth aspect of the present invention, there is provided the bonding structure of the bonding wire according to any one of the first to twelfth aspect of the present invention, wherein the metal R includes two elements consisting of either palladium and silver or palladium and gold.

According to a fourteenth aspect of the present invention, there is provided the bonding structure of the bonding wire according to the thirteenth aspect, wherein the concentrated layer A includes an alloy region comprised of either an alloy of palladium and silver or an alloy of palladium and gold, and another region containing palladium in a maximum concentration of 80 mol % or more.

According to a fifteenth aspect of the present invention, there is provided the bonding structure of the bonding wire according to any one of the first to fourteenth aspect, wherein the thickness of a region having an oxygen concentration of 10 mol % or more is in a range from 0 to 0.05 µm (excluding 0 µm) within a 1 µm-width region extending above and below the interface of the bonding part between the bonding wire and the ball bump.

According to a sixteenth aspect of the present invention, there is provided the bonding structure of the bonding wire according to any one of the first to fifteenth aspect, wherein the bonding wire includes a core material containing copper as a major component thereof, and an outer skin layer which contains the metal R as a major component thereof and covers the core material.

According to a seventeenth aspect of the present invention, there is provided the bonding structure of the bonding wire according to the sixteenth aspect, wherein the metal R which is the major component of the outer skin layer is one or more elements selected from palladium, gold and platinum.

According to an eighteenth aspect of the present invention, there is provided the bonding structure of the bonding wire according to the sixteenth or seventeenth aspect, wherein the thickness of the outer skin layer is in a range from 0.002 to 0.8 μm.

Effect of the Invention

The bonding structure of the bonding wire according to the present invention can provide the enhanced bonding strength in the reverse bonding connection using the copper-based bonding wire by inhibiting non-stick failures and peeling failures at the bonding part between the stud bump and the bonding wire to improve the continuous operability of bonding and to increase the bonding strength. Also, the bonding strength of the bonding part between the stud bump and the electrode can be improved. In addition, reliability in a high-temperature environment during the operation can be improved. To mention in more detail, the life of the bonding can be prolonged in each of a heat cycle test, heat impact test, high-temperature and high-humidity test, high-temperature and high-humidity bias test and high-temperature heating test. Also, the loop shape can be stabilized.

As a result, the operability and the productivity can be improved and the bonding reliability can also be improved in the reverse bonding connection using the copper-based bonding wire using inexpensive materials. It is possible to connect using the copper-based bonding wire in a packaging structure (stacked packaging) having a laminate structure obtained by stacking semiconductor chips and the multi-chip packaging, which are semiconductor packaging structures using the reverse bonding connection in many cases.

MODE FOR CARRYING OUT THE INVENTION

It has been found that as a method for improving the mass-productivity of the reverse bonding connection using a copper-based bonding wire, it is effective to form a concentrated layer A of a metal R at the interface of the bump/wedge bonding part where the bonding wire is wedge-bonded on a stud bump and further, a concentrated layer B of the metal R at the interface of an electrode/bump bonding part where the stud bump is connected to an electrode on a semiconductor device, to thereby reduce non-stick failures and peeling failures of wedge bonding, thereby improving the shear strength and the bonding reliability of the bump bonding part. Also, it has been found that it is effective to form a concentrated layer C of the metal R on the surfaces of the bump and the bonding wire at the bump/wedge bonding part in addition to the above concentrated layer A for improving a reliability in a high-temperature and high-humidity test. Moreover, it has been found that it is effective to form the above three layers of the concentrated layers A, B and C, at the same time for improving a reliability in a high-temperature and high-humidity bias test. It has also been confirmed that a multilayer copper bonding wire (hereinafter, referred to as "a multilayer copper wire") constituted of a core material containing copper as a major component thereof and an outer skin layer containing the metal R other than copper as a major component thereof is effective as one of the bonding wire material forming these concentrated layers. It is also effective to optimize the composition, structure or the like of the outer skin layer of the multilayer copper wire.

Figure 4:
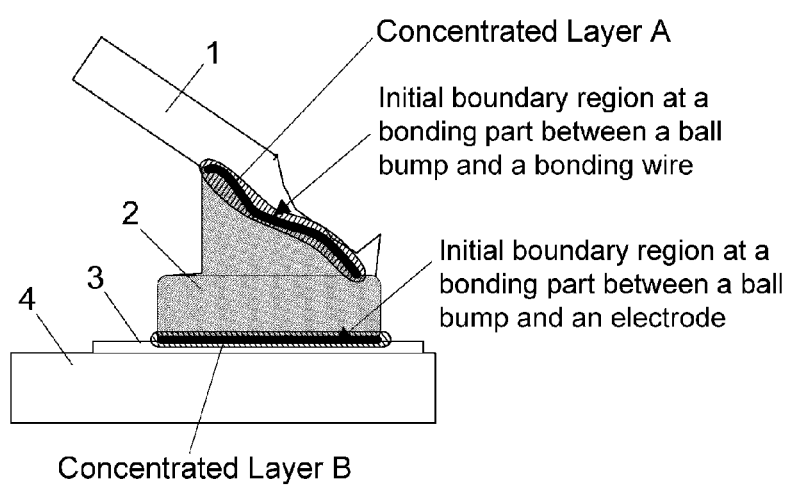
FIG. 4 is another view of FIG. 1 illustrating the concentrated layer A, an initial boundary at a bonding part between the ball bump and the bonding wire, and an initial boundary at a bonding part between the ball bump and the electrode.

The concentrated layer in this context means an area or a region where the concentration of the metal R is relatively higher than that in the center part of the ball bonding part. Because the structure of the concentrated layer at the interface or the surface of the ball bonding part often has a layer form, it is called a concentrated layer in this specification. The structure of the concentrated layer is not necessarily limited to a continuous layer form but includes a case where a part of the concentrated layer is formed discontinuously (intermittently). The above interface of the bonding part means the vicinity of an initial boundary at the bonding part between the ball bump and the electrode or at the bonding part between the ball bump and the bonding wire. See, FIG. 4.

It is to be noted that the term "major component" is defined as the component having a ratio of an element in concentration of 50 mol % or more based on the total concentration of metallic elements such as copper or the metal R.

In the following, the present invention will be described in detail.

The present invention relates to a bonding structure of a bonding wire by connecting the bonding wire onto a ball bump formed on an electrode of a semiconductor device, the bonding wire and the ball bump respectively containing copper as its major component, the bonding structure comprising a concentrated layer A provided at the interface of the bump/wedge bonding part, wherein the concentration of a metal R other than copper in the concentrated layer A is not less than ten times the average concentration of the metal R in the ball bump, and a concentrated layer B provided at the interface of the electrode/bump bonding part, wherein the concentration of a metal R in the concentrated layer B is not less than ten times the average concentration of the metal R in the ball bump. According to this structure, the concentrated layer A and the concentrated layer B are formed at the same time as the bonding structure, enabling improvements not only in the effect of inhibiting non-stick failures (NSF) and short tail failures which are the problems posed in the reverse bonding connection using the copper-based bonding wire, but also in the effect of increasing the shear strength at the interface of the electrode/bump bonding part and the effect of reducing chip damages at the same time. The non-stick failures, in this context, mean such a failure that peeling occurs at the bonding part where the bonding wire is wedge-bonded on the ball bump during the course of continuous bonding operations. The short tail failures mean such a failure that though the wedge bonding is well attained, the length and shape of a wire part (tail) projected from the end of the capillary are made unstable, in the stage of tail cutting which breaks the bonding wire after the wedge bonding, causing a defect in the shape and the size of the ball part formed by melting the tail. It may be expected that the productivity of the continuous bonding is remarkably enhanced by improving incompatible working performances such as non-stick failures, short tail failures, shear strength and chip damages which have been considered to be difficult to improve at the same time in the reverse bonding connection by the copper-based bonding wire.

Figure 1:
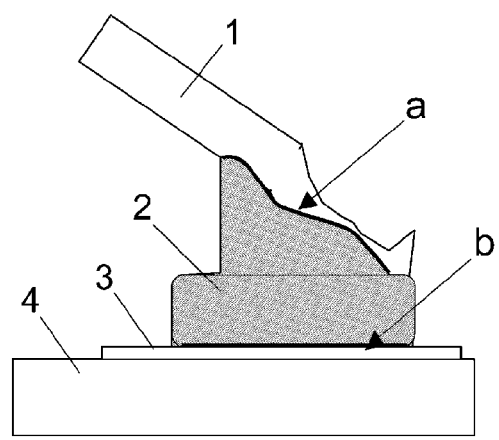
FIG. 1 is a view of a reverse bonding part where a bonding wire is wedge-bonded on a bump.

FIG. 1 shows the reverse bonding part of bonding wire. The ball part formed at the end of a bonding wire 1 is bonded on an electrode 3 of a semiconductor device 4 to form a bump 2

(stud bump) and then, the bonding wire 1 is wedge-bonded to the surface of the bump. As main interfaces of the bonding part (hereinafter, also referred to as an interface of the bonding part), two positions, that is, an interface a of the bump/wedge bonding part and an interface b of the electrode/bump bonding part are necessary. The concentrated layer A is formed at the bonding part interface a and the concentrated layer B is formed at the bonding part interface b.

Next, with regard to the concentrated layer A and the concentrated layer B, individual expected effects, combined actions of the both will be described.

By forming the concentrated layer A at the bump/wedge bonding part interface so that the concentrated layer A includes a region in which the concentration of the metal R is not less than ten times the average concentration of the metal R in the ball bump, the effect of improving the adhesion of the bonding part interface is enhanced. It is presumed that possible actions of the concentrated layer A may include inhibiting the progress of oxidation of copper on the surface of the bump while the stud bump is heated on the stage during the continuous bonding operations, promoting the diffusion of copper at the copper/copper interface to thereby improve the bonding strength, and promoting the breakage of an oxide film on the surface of the bump because concentrated layers often have a strong resistance to deformation.

Assuming that the bump side and the wire side are defined with respect to the initial bonding part interface, the concentrated layer A can be formed at either of the bump side or the wire side, or at both of the bump side and the wire side. When the concentrated layers are formed more on the bump side, a high effect of inhibiting oxidation of the surface of the bump mentioned above is expected, whereas when the concentrated layers are formed more on the wire side, the effect of increasing the bonding strength and the effect of destroying an oxide film on the surface of the bump are promoted. If the concentrated layer A is formed on both the bump and the wire sides, a higher effect is expected.

Forming the concentrated layer B at the electrode/bump bonding part interface so that the concentration of a metal R therein is not less than ten times that of the average concentration of the metal R in the ball bump, is advantageous to increasing the shear strength of the bonding part. As to the role of the concentrated layer B, it is considered that, in the case of an aluminum electrode, the concentrated layer B has, for example, the effect of controlling the diffusion of Cu atoms and Al atoms at the interface of the electrode/bump bonding part to attain a uniform growth of intermetallic compounds over the entire bonding part interface, and the effect of buffering ultrasonic vibration at the time of bonding to inhibit chip damages. It has been therefore confirmed that such actions of the interface concentrated layer are more notable when using aluminum electrodes, but not limited to this case, and the effect of improving a bonding reliability can be likewise obtained even when the electrode material is Au, Ag, Pd, Cu and the like.

By forming both the concentrated layers A and B, performances which have heretofore been considered to be difficult to improve such as tail failures and chip damages at the time of the wedge bonding can be improved in addition to the effects expected by the generation of respective concentrated layers mentioned above, and thereby remarkably enhancing the mass-productivity in the reverse bonding using the copper-based bonding wire. Although there are still unclear points in the mechanism of the combined functions of the concentrated layers A and B, they are considered to act effectively, by the formation of the both at the same time, to improve the efficiency of transfer of a load and a ultrasonic wave output energy to the bump/wedge bonding part interface, and to decrease useless vertical impacts and adhesion-decreasing vibrations to the electrode/bump bonding part interface, as well. As the result of easy achievement of such an efficient bonding, the proper range of the bonding condition is changed in two bonding processes, that is, the bump bonding of the ball part and the wedge bonding of the bonding wire and therefore, lowering the setting values of the load, ultrasonic vibration and the like is possible, which is considered to be effective to inhibit short tail failures and chip damages.

In the case that only the concentrated layer A is provided, non-stick failures still tend to decrease, but a sufficient effect is not necessarily obtained, and it is also difficult to improve short tail failures and the effect of improving chip damages cannot be expected. In the case that only the concentrated layer B is provided, the shear strength still tends to be increased, but the effect of improving chip damages is small and the effect of improving short tail failures cannot be expected.

As to the degree of concentration of the concentrated layer A, a high effect of reducing non-stick failures can be obtained by including therein the region in which the concentration of the metal R is not less than ten times the average concentration of the metal R in the ball bump. Preferably, if the concentration ratio of the metal R in the concentrated layer A to that in the ball bump is 100 or more, this further improves the effect of inhibiting short tail failures at the bump/wedge bonding part. There is no upper limit of the concentration of the metal R in the concentrated layer A, and the effects of the present invention can be obtained even if the concentrated layer A is comprised of the metal R itself.

It has been therefore confirmed that the region in which the concentration of the metal R is not less than ten times the average concentration of the metal R in the ball bump effectively acts on the aforementioned effect of increasing the bonding strength by the growth of intermetallic compounds in the concentrated layer B. Preferably, if the concentration ratio of the metal R in the concentrated layer B to that in the ball bump is 50 or more, this further improves the effect of improving the following conflicting characteristics such as increasing the shear strength and reducing chip damages at the electrode/bump bonding part at the same time. There is no upper limit of the concentration of the metal R in the concentrated layer B, and the effects of the present invention can be obtained even if the concentrated layer B is comprised of the metal R itself.

For the evaluation of the degree of concentration, the ratio of the concentration of the subject metal R in the concentrated layer to the concentration in the ball part is an important index showing the degree of concentration. In the calculation of the concentration, in this context, the ratio of the total concentration of metal elements such as the metal R and other metal elements such as copper is used. In other words, a concentration value is used that is obtained by calculating the same based on elements excluding non-metallic elements such as C, O, N, Cl and S. In the case where the metal R constituting the concentrated layer is plural elements, a value obtained by calculating the total concentration of the metal R is used. When the concentration in the concentrated layer is not constant but varies in the depth direction, the maximum concentration is used. On the other hand, an average concentration is used in the bump. In this case, the concentration is measured at optional three or more positions on the abraded section of the bump to obtain an average concentration.

Figure 3:
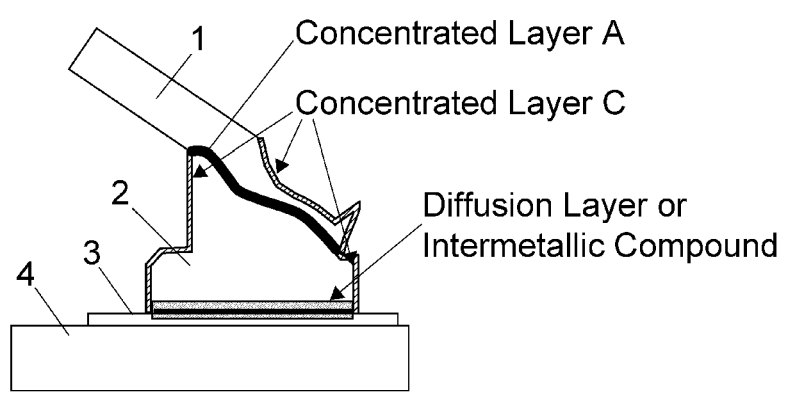
FIG. 3 is another view of FIG. 1 illustrating the concentrated layer C, the diffusion layer and the intermetallic compound.

For improving the reliability in the high-temperature and high-humidity test (PCT test), it is desirable to have a bonding structure of a bonding wire for connecting the bonding wire onto a ball bump formed on an electrode of a semiconductor device, the bonding wire and the ball bump respectively containing copper as its major component, the bonding structure comprising a concentrated layer A provided at the interface of the bump/wedge bonding part, wherein the concentration of a metal R other than copper in the concentrated layer A is not less than ten times the average concentration of the metal R in the ball bump, and a concentrated layer C (fXC) formed in 40% or more of a surface area of the ball bump and in 30% or more of a surface area of the bonding wire connected onto the ball bump, wherein the concentration of the metal R in the concentrated layer C is not less than five times the average concentration of the metal R in the ball bump. See, FIG. 3. In the PCT test for the reverse bonding of the copper-based bonding wire, water and ions diffuse to deteriorate the bonding strength of copper/copper of the bump/wedge bonding part, which is considered to be a primary reason of the failures. The concentrated layer C formed on the surfaces of the bump and the bonding wire exert the effect of inhibiting the penetration of water and ions into the bonding part interface. The effect of inhibiting the penetration of water and ions into the bonding part interface is expected to some extent, but not sufficient only with the concentrated layer C. A higher effect of inhibiting the penetration can be obtained by a combination of the concentrated layers A and C.

As a result of studies made on a percentage of the area occupied by the concentrated layer C, it is confirmed that if the area is 40% or more of the surface of the ball bump, it is effective to inhibit the penetration of water and ions into the bump/wedge bonding part interface through the inside of the bump, and similarly, if the area is 30% or more of the surface of the bonding wire connected to the ball bump, it is effective to inhibit the penetration of water and ions into the bonding part interface through the inside of the wire. It has been confirmed that in the concentrated layer C, an area in which the concentration of the metal R is not less than five times the average concentration of the metal R in the ball bump effectively acts to inhibit the penetration of water and ions. The concentration ratio of the metal R in the concentrated layer C to that in the ball bump is preferably 20 or more, and if the ratio is 20 or more, it may be expected to exert a high effect of further delaying the time at which a failure occurs in the PCT test. There is no upper limit of the concentration of the metal R in the concentrated layer C, and the effects of the present invention can be obtained even if the concentrated layer C is comprised of the metal R itself.

Here, as to the bonding wire connected onto the ball bump, the surface of the bonding wire, which falls in the range where the area of the bump is projected upward, is adopted. Accordingly, the very surface of the bonding wire and the surface of the bonding wire largely deformed by the capillary are included. This bump projected area was selected in view of the correlation with the transfer path of water and ions and the accelerated test in a high-temperature and high-humidity condition. As the transfer path, various paths can be considered which include a diffusion through the inside of the wire, a penetration to the bump/wedge bonding part interface from the crosswise direction and a transfer to the bonding part through the interface between the bonding wire and the resin. As a result of studies made on the premise as mentioned above, it has been found effective to regulate on the surface of the bonding wire falling in the projected bump area.

It is effective to form the above three concentrated layers A, B and C at the same time for improving the reliability in the high-temperature and high-humidity bias test (HAST test). In the HAST test, a more severe reliability is required by applying a larger electrical bias than in the above PCT test. The application of a bias accelerates the occurrence of failures because ions and the like diffused inside the resin are attracted to the wire bonding part and also because the wire bonding part generates heat. It is considered that in the HAST test for the reverse bonding using the copper-based bonding wire, the main reason of the failures is that water and ions diffuse to cause the corrosion of an intermetallic compound of aluminum/copper formed at the electrode/bump bonding part. The behavior of water and ions, which diffuse towards the bonding part interface, is accelerated by application of a bias. Therefore, in order to improve the characteristics required in the HAST test, it is effective to block the penetration of ions to thereby inhibit corrosion at the bonding part interface. It is considered that the improving mechanism of each concentrated layer works, against the diffusion of water and ions to the bonding part interface, such that the concentrated layer C protects the outside periphery of the bump/wedge bonding part, the concentrated layer A protects the bump/wedge bonding part interface from the penetration of water and ions, and the concentrated layer B inhibits the generation of corrosion and cracks at the electrode/bump bonding part interface. It has been found that if any one of these concentrated layers A, B and C is not formed, it is difficult to secure a sufficient reliability in the HAST test.

As the above metal R, palladium, gold, platinum, silver, rhodium, ruthenium and the like may be used. The metal R is preferably one or more elements selected from palladium, gold and platinum to obtain a high effect on improvement in the bonding ability and reliability of the reverse bonding. If the major component of the concentrated layer is at least any one of palladium, gold and platinum, the bonding ability of both the bump/wedge bonding and the electrode/bump bonding are improved at the same time. In this case, the concentrated layer effectively acts on the bonding and diffusion of the copper/copper interface and the aluminum/copper interface. Particularly, this has a high effect on improvement in the second pull strength. This is considered to be caused by relative easiness in promoting to diffuse copper and elements mentioned above. It is more preferable to use palladium as the metal R because this has a higher effect on ensuring the roundness of the ball bump shape and is also effective on fine pitch connection and bonding to an electrode having a small opening. Also, among the above three types of metals, palladium is most advantageous to reducing material costs.

Also, if the above metal R is constituted of two elements, that is, either palladium and silver or palladium and gold, this increases the bonding speed or the life of the capillary by reducing the load and the ultrasonic wave applied at the time of bonding to thereby reduce the contamination and the abrasion of the capillary, thereby making it possible to increase the productivity of the reverse bonding connection. As the action obtained by combining silver or gold with palladium, the generation of a recrystallized structure of the heat-affected zone in the vicinity of the ball can be controlled, so that the shape and surface irregularities of the ball bump formed by cutting this heat heat-affected zone are stabilized, showing that this combination is effective for realizing a high-speed bonding and an increase in the life of the capillary. It has been confirmed that it is effective to combine silver or gold with palladium because palladium alone has a small action on the control of the recrystallized structure of the heat-affected zone. The concentration of palladium is preferably higher than that of silver or gold to improve the above effect. If the proportion of silver or gold to the concentration of palladium is preferably in a range from 0.2 to 80%, this is effective to increase the bump formation speed by 5% or more and to increase the life of the capillary by 10% or more. It is not necessary that silver or gold is contained evenly in entire palladium constituting the concentrated layers A, B and C, and a sufficient effect is obtained by containing silver or gold in at least a part of palladium.

The bonding structure of the bonding wire is preferably a structure in which the concentrated layer A contains an alloy region (Pd alloy region) of either of the palladium-silver alloy or the palladium-gold alloy, and a region (Pd-concentrated region) where the maximum concentration of palladium is 80 mol % or more. The metal R is comprised of an element consisting of palladium and silver or an element consisting of palladium and gold in this bonding structure. Therefore, in addition to the effects of increasing the bonding speed and increasing the life of the capillary, the conflicting properties such as the roundness of the shape of the bump and the increase in peeling strength of the bump/wedge bonding part are improved, and therefore, this is effective to improve the yield of the reverse bonding connection performed at a fine pitch of 50 μm or less. The Pd alloy region is expected to have the action of increasing the peeling strength of the bump/wedge bonding part and the effect of promoting the deformation of the bump into a spherical form at the time of bump bonding by buffering an impact in wedge bonding. On the other hand, the Pd-concentrated region is expected to have the effect of inhibiting oxidation at the bump/wedge bonding part interface. The maximum concentration of palladium in the Pd-concentrated region is preferably 80 mol % or more to promote the effects of inhibiting oxidation and buffering an impact. Also, since the Pd alloy region is made of either an alloy of palladium and silver or an alloy of palladium and gold, it considered that silver or gold promotes the diffusion at the bonding part interface. The maximum concentration of silver or gold in all metal elements in the Pd alloy region is more preferably less than 50 mol %. This is because, if the maximum concentration of silver or gold exceeds 50 mol %, a highly concentrated alloy is formed and is therefore hardened to cause damages such as chip cracks at the time of bonding. If the thickness of the Pd alloy region is preferably in a range from 2 to 30 nm, the aforementioned effect of promoting the deformation of the bump into a spherical form at the time of bump bonding is increased, whereas if the thickness exceeds 30 nm, peeling strength may be reduced. Also, if the thickness of the Pd-concentrated region is preferably in a range from 10 to 100 nm, the above effect of inhibiting oxidation is sufficient, whereas if the thickness exceeds 100 nm, chip cracks may occur.

Preferably, in the concentrated layer A, the thickness of the region where the concentration of the metal R is 10 mol % or more is in a range from 0.01 to 4 μm, and in that case, the productivity of the continuous bonding can be further improved. To take specific examples, even in applications which have conventionally been considered to be difficult to apply the reverse bonding to, using the copper wire, such as bonding using thin wire having a wire diameter of 20 μm or less, or connecting chips stacked in three or more layers, the bump/wedge bonding ability can be improved to thereby increase the productivity of the continuous bonding. Here, if the concentration is 10 mol % or more, an effective action as the concentrated layer is expected. If the thickness is less than 0.01 μm, only a small improving effect is obtained, whereas if the thickness is 4 μm or more, there is a tendency that the continuous bonding ability is deteriorated.

More preferably, in the above concentrated layer A, the thickness of the region where the concentration of the metal R is 50 mol % or more is in a range from 0.005 to 0.8 μm, and this is advantageous in further increasing the bonding strength at the bump/wedge bonding part. Even in applications in which the reduced bonding strength has been regarded as a problem in the reverse bonding using the copper wire, such as fine pitch connection at an electrode interval of 70 μm or less and connections in an overhang type laminated chip, the bump/wedge bonding ability can be improved to thereby increase the productivity of the continuous bonding, as the applications being capable of receiving the benefit of this increased bonding strength. The above-mentioned more preferable ranges are proposed because, if the concentration is 50 mol % or more, the effective action as the concentrated layer is expected, if the thickness is less than 0.005 μm, the improving effect is small whereas if the thickness is 0.8 μm or more, damages may be given to chips formed under the electrode where the bump is formed.

In the reverse bonding structure, it is preferable to provide such a structure that the above concentrated layer A is provided at the bonding interface of the bump/wedge bonding part, and, the thickness of a region where oxygen is contained in an amount of 10 mol % or more is in the range from 0 to 0.05 μm (excluding 0 μm) within a 1 μm-width region extending above and below the interface of the bonding part between the bonding wire and the ball bump. This bonding structure makes it possible to improve not only the continuous bonding ability but also high-temperature reliability. Particularly, this bonding structure is effective to improve the reliability in the heat cycle TCT test. As discussed above as the problem of the reverse bonding using a copper wire, it is considered that wedge bonding to the oxidized surface of an bump, non-bonded clearances produced at the bump/wedge bonding part interface and the like are the causes inducing the occurrence of defectives in the vicinity of the bump/wedge bonding part due to the heat strain in the TCT test. On the other hand, the initial bonding strength is improved and the progress of oxidation at the clearances of the interface is inhibited by reducing the concentration of oxygen at the bump/wedge bonding part interface, ensuring that a peeling and a wire breakage associated with the heat strain can be reduced. This is because, if the concentration of oxygen is 10 mol % or more, it acts to facilitate retardation of the diffusion at the interface, and if the thickness of the region where the concentration of oxygen is 10 mol % or more exceeds 0.05 μm, it reduces the bonding strength, leading to increase in percent defectives in the TCT test. The thickness of the region where oxygen is contained in a concentration of 20 mol % or more is preferably in a range from 0 to 0.03 μm (excluding 0 μm), and in that case, the effect of further increasing the life in the TCT test is obtained.

In the above concentrated layer B, the thickness of the region where the concentration of the metal R is 3 mol % or more is preferably in a range from 0.01 to 5 μm. Such concentrated layer B can realize, in addition to the effects of reducing chip damages and increasing the shear strength, the high effect of improving a bonding reliability at high temperatures. When the reverse bonding connection using the copper wire is subjected to a high-temperature heating test made at a temperature of 150° C. or more, failures frequently occur at the electrode/bump bonding part, giving rise to the problems that voids are produced at the bonding part interface, causing reduced strength by the formation of voids and increased electric resistance by corrosion reaction. Particularly, the occurrence of corrosion is problematic. That is, the problem is that a Cu—Al-based intermetallic compound formed at the bonding part interface between an aluminum electrode and a copper bump undergoes a corrosion reaction with the sealing resin component (halogen component and the like). It is considered that the concentrated layer B formed at the electrode/bump bonding part interface can inhibit the diffusion of the sealing resin component in the bonding part, and can also retard the growth of an intermetallic compound susceptible to corrosion, to thereby improve a high-temperature reliability. Here, the above-mentioned preferable ranges are proposed because the effect of improving the reliability is still small if the thickness of the region where the concentration of the metal R in the concentrated layer B is 3 mol % or more is less than 0.01 μm, whereas voids may be formed due to the diffusion inhibiting effect at the initial bonding stage if the layer of more than 5 μm in thickness is formed. Preferably, the thickness of the region where the concentration of the metal R is 10 mol % or more is in a range from 0.005 to 2 μm, whereby it is possible to obtain the higher effect of improving the life in the high-temperature heating test made at a higher temperature as high as 175° C. or more.

If the thickness of the region where the concentration of the metal R in the above concentrated layer A is 50 mol % or more is not less than three times that of the region where the concentration of the metal R in the concentrated layer B is 50 mol or more, this is advantageous to improving the reliability in the reflow test. In the reflow test, failures often occur at the bump/wedge bonding part in the reverse bonding connection due to a large external force applied to the bonding part by a heat impact. It has been confirmed that the strong resistance to an external force in the shear direction can be obtained by including the region where the concentration of the metal R is 50 mol % or more in the concentrated layer, and more resistance to the heat impact can be obtained if the bump/wedge bonding part is more resistant to the shear load than the electrode/bump bonding part. In other words, it is considered that when comparing the thicknesses of the regions where the concentration of the metal R is 50 mol % or more, if the concentrated layer A of the bump/wedge bonding part is thicker than the concentrated layer B of the electrode/bump bonding part, then it copes with a heat impact in a well-balanced manner, thereby improving the reliability of the reflow test. If the ratio of the thicknesses is less than three, the effect of withstanding the heat impact in the reflow test is small. The ratio is preferably five or more. If the ratio is five or more, resistance to the heat impact is improved and therefore, a high reflow reliability can be obtained even in the case of using a sample obtained by low-temperature bonding.

In the above concentrated layer C on the surface of the bump, the thickness of the region where the concentration of the metal R is 0.5 mol % or more is preferably in a range from 0.05 to 20 μm, whereby the performance in the HAST test is further improved. This is because the region where the concentration of the metal R is 0.5 mol or more is expected to have a sufficient effect of inhibiting the penetration of water and ions, and when this thickness of the region is less than 0.05 μm, the improving effect is small whereas when the thickness exceeds 10 μm, the wedge bonding ability on the bump is deteriorated, leading to a case where the continuous bonding ability is deteriorated. Though there are many cases that the thickness of the concentrated layer C is different between on the surface of the bump and on the surface of the wire within the above-mentioned projected area, the consistency with the results of the HAST test is more easily regulated based on the thickness of the concentrated layer C on the surface of the bump, and the thickness of the concentrated layer C is measured on the surface of the bump more easily.

In the electrode/bump bonding, the effects of increasing a shear strength or improving a bonding reliability at high temperatures can be enhanced by forming the concentrated layer B even in the case where there is formed a diffusion layer or an intermetallic compound each being constituted primarily of major components of the electrode and copper. Particularly, such a bonding structure of the bonding wire is desirable that at least a part of the concentrated layer B formed at the interface of the ball bonding part is formed inside of at least one of the diffusion layer and the intermetallic compound constituted primarily of the major components of the electrode and copper. The metal R-concentrated layer B inside of the above diffusion layer or the intermetallic compound (hereinafter, generically called "compound concentrated layer B) exerts the function of controlling the inter-diffusion of copper and the major components of the electrode at the bonding part interface to thereby raise the heat resistance in the reliability test by 10° C. or more. It is considered that the compound concentrated layer B exerts, as one of its roles, a barrier function of blocking the transfer of, for example, gas or ions produced from the resin to the interface of the ball bonding part. In the case where the region where the metal R is concentrated is limited to the inside of the diffusion layer or the intermetallic compound in the vicinity of the bonding part interface, that is, in the case where the conductive metal is concentrated primarily in the above compound concentrated layer, a sufficient high-temperature reliability can also be obtained. Moreover, the effect of improving the bonding reliability is further improved by the co-existence of the compound concentrated layer which is concentrated in the diffusion layer or the intermetallic compound and a concentrated region formed in the copper ball close to the bonding part interface.

Also, since at least apart of the above concentrated layer B is formed inside at least any one of the diffusion layer and the intermetallic compound, and the thickness of the region where the concentration of the metal R is 0.5 to 30 mol % is 0.01 μm or more, the effect of improving a bonding reliability can be obtained by inhibiting the corrosion of the intermetallic compounds caused by heating or the like. This is because that if the concentration of the metal R in the compound concentrated layer B is 0.5 mol % or more, there is a sufficient barrier effect to inhibit the corrosion, whereas in order to exceed 30 mol of the metal R, a specific material in which the concentration of the metal R contained in the copper wire is significantly increased is required, bringing about many disorders such as a deterioration in bonding ability, and there is therefore the case where the characteristics required for the wire bonding cannot be satisfied. It is preferable that the thickness of the region where the above concentration is in a range from 2 to 20 mol % is 0.01 μm or more to further enhance the effect of improving the bonding reliability. When the thickness of the region having the above concentration range is 0.01 μm or more, the aforementioned sufficient action effects are obtained, whereas when the thickness is less than 0.01 μm, there is the case where the effect of improving the reliability is not stabilized.

The above diffusion layer is a random alloy constituted primarily of the major components of the electrode and copper. Many of these diffusion layers have a concentration gradient. The concentration of the major components of the electrode contained in the above diffusion layer is preferably in a range from 1 to 30 mol %. The reason is that if the concentration is less than 1 mol %, the aforementioned effect of improving the bonding reliability is small even if the concentrated layer B is formed in the diffusion layer, whereas there is the case where the formation of the diffusion layer in which the electrode components are contained in an amount exceeding 30 mol % as a solid solution is unstable. It is also desirable that the diffusion layer has an internal concentration gradient. This is because the concentration gradient moderates the convergence of the heat stress, and therefore, the ball bonding part can bear to external forces such as the thermal expansion of the sealing resin to maintain a sufficient bonding strength. In the case where the electrode is made of, for example, an aluminum alloy (Al—Si, Al—Cu and Al—Si—Cu), the diffusion layer preferably includes Al, Cu and the metal R, in which Al is contained in an amount ranging from 3 to 22 mol %. This is because a Cu—Al-based diffusion layer containing 3 to 22 mol % of Al can be grown relatively easily, and is stable even if the metal R is concentrated, and also has a high effect of increasing a bonding reliability.

The above intermetallic compound is an ordered alloy constituted primarily of the major components of the electrode and copper, and differs from the diffusion layer in that it has this regularity. In most cases, any of the phases in an intermetallic compounds whose existences are known in an equilibrium phase diagram is formed also at the ball bonding part. The phase of the intermetallic compound is classified into a case where a binary intermetallic compound phase constituted primarily of the major components of the electrode and copper contains the metal R, or into a case where a ternary intermetallic phase constituted of the major components of the electrode, copper, and the metal R is formed. In any phases, a good bonding reliability can be obtained. Particularly, if the concentrated layer is formed inside of the intermetallic compound, a high effect of improving the bonding reliability can be obtained. Particularly, the life under heating at a high temperature of 175° C. or more can be prolonged not less than 1.2 times.

In specific examples using, for example, a most general material, $CuAl_2$, CuAl or $Cu_9Al_4$ phase is preferable as the binary intermetallic compound phase in the case of using an aluminum alloy (Al—Si, Al—Cu Al—Si—Cu), and a bonding reliability is improved by concentrating conductive metals inside of at least one phase of these intermetallic compounds. Also, in the case where a ternary intermetallic compound phase of aluminum, copper and this conductive metal is formed at the ball bonding part on the electrode of the above aluminum alloy, it is desirable that the conductive metal is concentrated inside of this ternary intermetallic compound phase. The concentration of the conductive metal is preferably 1 to 20 mol %, and thus a high effect of improving the bonding reliability can be obtained.

With regard to a concentration analysis method to confirm the concentrated layer on the surfaces of the ball bump and bonding wire, it may be evaluated by analyzing the surface of the ball by utilizing EPMA (Electron Probe Micro Analysis), EDX (Energy Dispersive X-Ray Analysis), AES (Auger Electron Spectroscopy) and the like. When there is a distribution of concentration on the surface of the ball bonding part, the concentration can be determined by measuring at two or more positions on the surface of the same bonding part. In AES, it is effective for the evaluation of the above composition and the film thickness to analyze the concentration in the depth direction with sputtering the surface.

With regard to the analysis of the concentration on the bonding part section at the bump/wedge bonding part and the electrode/bump bonding part, point analysis or line analysis techniques can be utilized by using EPMA, EDX, AES and the like. The analytical area is desirably shown by an average concentration in an area of 0.1 μm or more in diameter, and more preferably in an area of 1 μM or more in diameter for improving the accuracy of analysis. When, for example, the position of the interface concentrated layer cannot be specified, the line analysis is desirable in the vicinity of the bonding part interface. When the position of the interface concentrated layer is clarified, the point analysis is a convenient technique. In order to evaluate the presence of the concentrated area by the point analysis, it is preferable to analyze the concentration of at least two positions, that is, the concentrated area and an area which is within the ball bonding part and is sufficiently apart from the bonding part interface.

In the line analysis, it is fundamentally necessary to analyze the concentration of an area across the vicinity of the bonding part interface. The start point and the end point of the line analysis will be described for the case that the diffusion layer or the intermetallic compounds is formed and for the case not formed. When the diffusion layer or the intermetallic compounds is formed, the line analysis is carried out in an area across the whole diffusion layer or the intermetallic compound wherein the start point and the end point are preferably at least 2 μm or more apart from both ends of all of the diffusion layer and the intermetallic compound to the ball side and the electrode side respectively. On the other hand, when the diffusion layer or the intermetallic compounds is not formed or the existence of them is not clear, the start point and the end point of the line analysis are preferably at least 2 μm or more apart side from the initial bonding part interface of the ball bonding part to the ball side and the electrode respectively. The concentrated layer formed at the interface of the ball bonding part can be confirmed relatively easily by such a line analysis technique.

The above concentrated layers A, B and C may be analyzed using any of a delivered semiconductor final product or a semiconductor which is actually used by being mounted on an electronic device. The concentrated layer exerts its action effect as long as its concentration and thickness fall within the scope defined in the present invention even when the bonding part is observed whether the semiconductor is in a delivery stage or in an actually working stage.

The bonding wire forming the above concentrated layer is preferably a multilayer copper wire including a core material using copper as its major component and an outer skin layer which is formed on the core material and contains, as its major component, the metal R different in component from the core material. One of the advantages of the multilayer copper wire is that the concentrated layer is easily formed by utilizing current bonding technologies and apparatuses as they are. For comparison, a monolayer copper wire alloyed by adding the metal R may be used. However, there is the case where, for example, a treatment and a step for forming the concentrated layer are required. In the formation of the aforementioned predetermined concentrated layer, it is effective to optimize the thickness, composition and structure of the outer skin layer of the multilayer copper wire.

Additionally, it is effective to connect by the above multilayer copper wire for measures taken to form the bonding structure in which at least apart of the concentrated layer B of the electrode/bump bonding part is formed in either of the diffusion layer and the intermetallic compound. This is because it is easy to control, for example, the distribution and the thickness of the concentrated layers at the bonding interface by adjusting, for example, the component, thickness, concentration gradient and composition of the outer skin layer. For example, in many cases, it is effective to increase, for example, the thickness of the outer skin layer, to raise the ratio of the conductive metal and to control the composition of the diffusion layer formed at the interface between the outer skin layer and the core material in order to form the concentrated layer B inside of the intermetallic compound. Also, as connecting technologies for promoting the formation of the concentrated layer B inside of the intermetallic compound, it is effective to use a nitrogen gas as an atmospheric gas in the formation of the ball. It is believed that, at the arc discharge for the formation of the ball, promotion of the segregation of the conductive metal on the surface of the ball while inhibiting oxidation of the surface of the ball promotes the formation of the concentrated layer inside of the intermetallic compound grown at the bonding part.

As the metal R constituting the outer skin layer of the multilayer copper wire, for example, palladium, gold, platinum, silver, rhodium and ruthenium may be used. If the metal R constituting the outer skin layer is preferably one or more elements selected from palladium, gold, silver and platinum, the effect of the above concentrated layer is improved and also, a high effect on the stable control of the loop shape of the reverse bonding can be obtained. If the major component of the outer skin layer is palladium, gold, silver and platinum, the oxidation of the surface of the wire is inhibited, and therefore weakening the ultrasonic vibration required for the wedge bonding on the bump. As a result of studies made on the loop control in the reverse bonding has been studied, it is confirmed that the ultrasonic vibration promotes the disorder of a loop shape. It is effective to use a multilayer copper wire constituted of a core material which contains copper as its major component and is coated with an outer skin layer containing, as its major component, palladium, gold, silver or platinum which has a high effect on inhibition of surface oxidation, to stabilize the loop shape in the reverse bonding of a copper-based bonding wire which has been considered to be difficult. It is more preferable for the fine pitch bonding that the metal R constituting the outer skin layer be palladium to make a ball shape a true spherical form and to obtain a high effect of stabilizing the size.

Preferably, there is provided a reverse bonding structure using the multilayer copper wire provided with a core material which contains copper as its major component and is coated with an outer skin layer containing palladium as its major component, wherein the concentrated layers A and B in which is ten times or more the average concentration in the ball bump are formed at the bump/wedge bonding part and the electrode/bump bonding part respectively. According to this structure, the effect of inhibiting stripping failures at the wedge bonding part can be obtained. The stripping failure is such a phenomenon that when a bonding wire is tail-cut after the wedge bonding on the bump, the bonding wire is partly peeled from the end part of the bonding part. It is considered that the stripping failures are caused by combined actions of factors such as a reduction in the bonding strength of the wedge bonding part on the bump and variations in a tail-cut length and in the diameter of the ball. In order to inhibit this stripping failure, the concentrated layers A and B are formed at the same time using the bonding wire coated with palladium, which makes it effective to transfer the load of the bump/wedge bonding part and ultrasonic vibration to the interface, thereby improving the stripping failure.

The major component of the core material is copper and high-purity copper having a purity in a range from 99.99 mol % (4 N) to 99.9999 mol % (6 N) or a copper alloy obtained by adding an alloy element may be used. Because the ball part can be softened with the high-purity copper, this high-purity copper is effective to reduce chip damages in bonding. It is also preferable that one or more additive elements selected from P, Ir, B, Zr, Bi, Ag and rare earth elements is contained as the alloy element to be contained in the copper alloy used for the core material, and the concentration of the additive elements in the entire bonding wire is in a range from 0.0001 to 0.03 mol %. According to the above, the bonding wire connected by the reverse bonding is improved in linearity. If the concentration of these additive elements is less than 0.0001 mol %, the above improving effect is reduced, whereas if it exceeds 0.03 mol %, wrinkled recesses are generated on the surface of the ball, causing an unstable ball shape.

Though the structure of the outer skin layer may have a monolayer structure, it can have a two-layer structure. If the outer skin layer has a monolayer structure containing the metal R as its major component, such advantages are obtained that an improved productivity by the relatively easy control of film thickness and film quality, and a wider proper margin of wedge bonding conditions on the bump. More preferably, if the outer skin layer has a monolayer structure containing any one of metals selected from palladium, gold and platinum as its major component, such advantages are obtained that a simple process is used to manufacture the bonding wire, leading to a cost reduction. On the other hand, when the outer skin layer has the two-layer structure, it is possible to carry out the reverse bonding using a combination of the aforementioned palladium, gold, silver and platinum. It has been therefore confirmed that the combination of the major components of the outermost surface/second layer is preferably palladium/gold, for example, the shape of the ball and loop control are most stabilized.

Also, if the combination of the major components of the outermost surface/second layer is a gold-palladium alloy/palladium or a silver-palladium alloy/palladium, the abrasion of the inside wall of the capillary is reduced, which is effective to inhibit the scratching of the surface of the wire and to prolong the life of the capillary. In the case of carrying out a complicated loop control, there is the case where the life of the capillary may be shortened and the productivity of the bonding process is reduced with only using palladium. It is considered that this is caused by the characteristics of palladium, which has a hard surface, and is easy to be seized with alumina which is the fundamental composition of the capillary, and has a high friction coefficient. The formation of the outermost layer constituted of a silver-palladium alloy or a gold-palladium alloy on the outside of the palladium layer enables to reduce the seizure when the wire is moved at high speed through the hole part of the capillary to inhibit the abrasion of the inside wall of the capillary, and to increase the life of the capillary, with the result that this is also effective to reduce scratches on the surface of the wire loop. If the concentration of silver or gold in the alloy is preferably in a range from 5 to 60 mol %, the effect of increasing the life of the capillary is high. If the concentration exceeds 60 mol % on the other hand, there is a fear that tail-cutting ability of the wedge bonding is deteriorated, causing a variation in the diameter of the ball. Also, as to the thickness of each layer, if the thickness of the outermost layer constituted of a silver-palladium alloy or a gold-palladium alloy is preferably in a range from 5 to 70% with respect to the thickness of the palladium layer. This reason is that if the thickness is in the above range, the above effect is significant, whereas if the thickness exceeds 70%, the occurrence frequency of failures such as eccentricity and spear marks in the formation of the ball is increased.

If the thickness of the outer skin layer is preferably in a range from 0.002 to 0.8 μm, the wedge bonding ability on the bump is improved, and a higher effect of increasing the second pull strength in the reverse bonding can be obtained. Also, this is advantageous to stabilizing the loop shape in the reverse bonding. If the thickness is less than 0.002 μm, the higher effect of further enhancing the inhibition of oxidation and bonding ability of the copper wire than those of the monolayer copper wire is not obtained, also there is the case where, because the film is too thin, controlling the film thickness is difficult. If the film has a thickness exceeding 0.8 μm, the hardness of the surface of the wire is increased, and there is therefore a limit in improving the adhesion of the bump/wedge bonding part, the second pull strength may not be increased as much as expected. If the thickness of the outer skin layer is preferably in a range from 0.01 to 0.4 μM, the effect of stabilizing the loop shape in the reverse bonding can be enhanced. If the thickness of the outer skin layer is more preferably in a range from 0.01 to 0.2 μm, the effect of reducing chip damages of the ball bonding part is more enhanced while the wedge bonding ability is improved. Here, the boundary of the outer skin layer is defined as a position where the total detected concentration of the metal R constituting the outer skin layer is 50 mol %, Accordingly, the outer skin layer in the present invention means the surface side from the position where the total detected concentration of the metal R constituting the outer skin layer is 50 mol %, that is, positions where the total detected concentration of the metal R constituting the outer skin layer is 50 mol or more.

Examples of the method of forming the outer skin layer on the surface of the core material of copper include the plating method, vapor deposition method and fusion method. In the plating methods, either the electrolytic plating method or the electroless plating method may be used to produce the outer skin layer. In the electrolytic plating also called as a strike plating or a flash plating, a plating speed is high and an adhesion to the base is good. The solution to be used in the electroless plating is classified into a substitution type and a reducing type. When the film is thin, it is enough to use the substitution type plating only. However, when a thick film is formed, it is effective to perform the reducing type plating after the substitution type plating in a stepwise manner. Although the electroless plating method is easily carried out because simple equipment is used, it requires more time than in the electrolytic method.

In the vapor deposition method, methods utilizing physical adsorption such as the sputtering method, ion plating method and vacuum deposition method, and methods utilizing chemical adsorption such as the plasma CVD (Chemical Vapor Deposition) may be used. All these methods are performed in a dry system. Therefore, washing after the film formation is not necessary and therefore, these methods are free from fears concerning surface contaminations in washing.

In the stage at which a plating or a vapor deposition is carried out, it is effective to use either of the method in which a conductive metal film having an intended wire diameter is formed and a method in which, after forming a film with a large diameter core material, wire is drawn two or more times until an intended wire diameter is obtained. In the former method of forming a film having a final diameter, the production, quality control and the like are simple, whereas in a combination of the latter method of forming a film and the wire drawing, it is advantageous to improve the adhesion between the film and the core material. As specific examples of each forming method, it is possible to use a technique for forming a film on the copper wire having an intended wire diameter by drawing a wire continuously through an electrolytic plating solution, or a technique for forming a film by dipping a thick copper wire in the electrolytic or electroless plating solution to obtain the final diameter by drawing a wire.

It is effective to carry out a diffusion heat treatment by heating as a process of forming a gradient of the concentration of copper in the outer skin layer and exposing copper from the outermost surface when using the outer skin layer formed by the above techniques and a core material. This is a heat treatment for promoting the inter-diffusion between copper and the conductive metal at the interface between the outer skin layer and the core material. The method in which the heat treatment is carried out with drawing a wire continuously is superior in productivity and quality stabilization. However, the distribution of copper on the surface and inside of the outer skin layer cannot be controlled only by simply heating the wire. Even if a stress relief annealing employed in an ordinary wire production is applied as it is, it is difficult to completely solve the problems such as unstable loop control by a reduction in the adhesion between the outer skin layer and the core material, occurrence of clogs in the capillary by the accumulated wire, and reduction of bonding strength by oxidation of copper exposed from the surface. In light of this, it is important to control the temperature, speed, time period and the like of the heat treatment.

It has been confirmed that good ball bonding ability are obtained even if a pure $N_2$ gas is used as the shielding gas in the formation of the ball, as a method of bonding a conventional multilayer copper wire provided with an outer skin layer and a core material according to the present invention. Specifically, this is a method of bonding in which using a bonding wire having a core material containing copper as its major component and an outer skin layer which is provided on the core material and contains the metal R and copper which are different in one or both of the components and the compositions from the core material, and having a thickness of the outer skin layer is from 0.021 to 0.12 μm, to bond the ball part by generating arc discharge while blowing an $N_2$ gas having a purity of 99.95 vol % or more to the end of the wire or its vicinity to form a ball part. If an inexpensive pure $N_2$ gas is used in place of a 5 vol % $H_2+N_2$ gas, which is a standard gas, in this bonding method, the running cost can be reduced to promote the practical use of the copper-based bonding wire.

Although good bonding ability can be obtained even if the shield gas to be used for forming the ball of the multilayer copper wire according to the present invention is the standard 5 vol % $H_2+N_2$ gas, the same good characteristics can be likewise obtained even by using a pure $N_2$ gas. When the thickness of the outer skin layer is 0.021 μm of less, the use of the pure $N_2$ gas poses a problem concerning the production of an eccentric ball. Also, when the thickness exceeds 0.12 μm, the use of the pure $N_2$ gas causes wrinkled projections or micro pores are generated on the surface of the ball. Therefore it is difficult to obtain a smooth ball surface. It is also one of the advantages obtained by selecting this thickness range that when the thickness of the outer skin layer is in a range from 0.021 to 0.12 μm, a high ball forming ability is obtained by using the pure $N_2$ gas. If the thickness of the outer skin layer is 0.035 μm or more within the above range, the true roundness is further improved. The reason why the purity of the pure $N_2$ is 99.95 vol % or more is that it is the range of the guaranteed concentration of $N_2$ gas which is an industrially available inexpensive gas, and therefore, the ball can be well formed.

Generally, the addition of the 5 vol % $H_2$ gas is considered to be effective to stabilize the arc discharge and to inhibit oxidation of the molten ball. In the pure $N_2$ gas on the other hand, the arc discharge is unstable and oxidation of copper progresses preferentially, causing an unstable ball shape in the case of the monolayer copper wire or in the conventional case where the outer skin layer is thin even using a multilayer copper wire when the bonding wire is melted to form the ball. On the other hand, if the outer skin layer is within the scope of the present invention, it is considered that oxidation of the ball can be inhibited even in a pure $N_2$ gas atmosphere because the metal R in the vicinity of the surface stabilizes the arc discharge and the outer skin layer is melted preferentially to play a protective role. It has been confirmed that there is the case where the bonding strength of the ball bonded with a pure $N_2$ gas is higher than in the case of using the 5 vol % $H_2+N_2$ gas in some bonding conditions.

Moreover, it has been confirmed that the formation of the ball with a pure $N_2$ gas tends to vary depending on the type of metal R constituting the outer skin layer as well as above thickness of the outer skin layer. It has been also confirmed that particularly, when the metal R constituting the outer skin layer contains, as its major component, one or more elements selected from palladium, gold and platinum, it is relatively easy to improve the true roundness and stabilize the size of the ball in the formation of the ball with a pure $N_2$ gas.

Examples

The present invention will be described in detail by way of examples.

For cupper as the raw material of the bonding wire, a high purity material having a purity of about 99.99 wt % or more was used, and an alloy having an appropriate amount of P, B, Zr, Bi, La and the like added thereto as alloy elements according to the need was melted to produce an ingot. A raw material having a purity of 99.99 wt % or more was prepared as each material of Pd, Au, Pt and Ag for an outer skin layer. In the case of a monolayer copper wire, predetermined alloy elements were added and melted to produce an ingot. In the manufacturing of a multilayer copper wire, a high-purity copper wire or copper alloy wire narrowed to a certain wire diameter was prepared as a core material in advance, and the electrolytic plating method, the electroless plating method, the vapor deposition method, the fusion method or the like was conducted in order to form an outer skin layer made of a different metal on the surface of the wire. In the case of forming the concentration gradient, heat treatment was performed. Utilized was a method in which the outer skin layer having a final wire diameter was formed or a method in which, after the outer skin layer having a certain wire diameter was formed, it was further narrowed to a final wire diameter by a wire drawing processing. A plating solution commercially available in semiconductor applications was used as the electrolytic plating solution and the electroless plating solution, and the sputtering method was used to carryout vapor deposition. A wire having a diameter of about 50 to 200 μm was prepared in advance, and the surface of the wire was coated by vapor deposition, plating or the like. Then, the wire was drawn to a final diameter of 15 to 75 μm and finally heat-treated to relieve processing strain such that its elongation value was about 4%. The wire drawing was carried out in a range from 5 to 100 m/min. According to the need, the wire was drawn using a dice to have a wire diameter of 30 to 100 μm, and then subjected to diffusion heat treatment, followed by wire drawing processing.

In the case of using the fusion method, adopted were a method in which a molten metal was cast in the periphery of a core material manufactured in advance and a method in which a molten copper or copper alloy was cast in the center of a hollow column manufactured in advance. Thereafter, processing such as forging, rolling, and wire drawing using a dice, and heat treatment were carried out to manufacture a bonding wire.

In the heat treatment of the wire in this example of the present invention, the wire was heated while being continuously drawn. For example, a scheme of locally introducing temperature inclination and a scheme of varying the temperature in the furnace were utilized. For instance, a heat treating furnace was utilized which was so remodeled that the temperature inside of the furnace was divided into three partitions to be able to control each divided partition. The temperature inside of the furnace was set to a range from 200 to 700° C. and the wire drawing speed was adjusted to a range from 10 to 500 mm/min. The wire drawing speed or the like, at the same time with the distribution of temperature was optimized. In the atmosphere of the heat treatment, an inert gas such as $N_2$ or Ar was also utilized for the purpose of inhibiting oxidation. The gas flow rate was adjusted in a range from 0.0002 to 0.004 $m^3$/min and was also utilized for controlling the temperature inside of the furnace. In connection with the timing of the heat treatment, samples were prepared according to two kinds of cases where the plating layer was formed after the heat treatment of the copper wire in succession to the wire drawing and where the heat treatment was carried out each time after the wire drawing and after the formation of the plating layer.

In order to measure the film thickness on the surface of the multilayer copper wire, surface analysis and depth analysis by means of AES were made. The concentrations of metals in the wire were measured by, for example, ICP analysis and ICP mass analysis.

Figure 2:
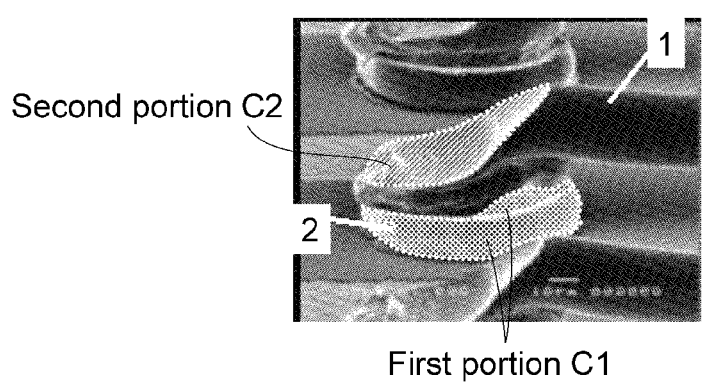
FIG. 2 is an SEM photograph of a reverse bonding part formed using a copper-based bonding wire.

For the connection of the bonding wire, a commercially available auto-wire bonder (trade name: Eagle 60-AP type, manufactured by ASM) was used to carry out reverse bonding. A ball part formed at the end of a wire was bonded to an electrode film on a silicon substrate by arc discharge and then, the bonding wire was cut to thereby form a bump. Next, after the ball part was ball-bonded on a lead electrode, the loop shape was controlled to wedge-bond the other end of the wire to the above bump. FIG. 2 shows an example of a SEM (Scanning Electron Microscope) photograph of the bonding part of the reverse bonding using a copper-based bonding wire. As the shield gas used to inhibit oxidation in the formation of the ball, a standard 5 vol % $H_2+N_2$ gas and a pure $N_2$ gas were used. Except for the evaluation of the ball shape, the 5 vol % $H_2+N_2$ gas which was the standard gas was basically used. The gas flow rate was adjusted in a range from 0.0003 to 0.005 $m^3$/min.

As the counter material of the bonding, a 1-μm-thick Al alloy film (Al-1 mass % Si-0.5 mass % Cu film, Al-0.5 mass % Cu film) which was the material of the electrode film on the silicon substrate was used. On the other hand, as the counter material of the wedge bonding, a lead frame plated with Ag (thickness: 1 to 4 μm) on the surface thereof or a resin substrate having an electrode structure of Au plating/Ni plating/Cu was used.

In the evaluation of the continuous bonding ability of the reverse bonding, 2000 wire connections were conducted to evaluate by the number of non-stick failures and the number of short-tail failures of the wedge bonding on the bump. The continuous bonding ability was evaluated at three levels, that is, the connection in the condition of a wire diameter of 25 μm and an electrode pitch of 80 μm, the connection in the condition of a wire diameter of 20 μm and an electrode pitch of 65 μm and the connection in the condition of a wire diameter of 18 μm and an electrode pitch of 50 μm respectively. For accelerated evaluation, in the evaluation of the non-stick failure, the load and the ultrasonic vibration were each set to a slightly lower level than those in the mass-production condition, while in the evaluation of the short-tail failure, the load and the ultrasonic vibration were each set to a slightly higher level. In the evaluation of each of the non-stick failure and the short-tail failure, the case where the number of failures is six or more is represented by the symbol "×" because the bonding is not sufficient, the case where the number of failures is three to five is represented by the symbol "Δ", the case where the number of failures is one or two is represented by the symbol "○" because the bonding is regarded as practical when the bonding condition is optimized, and the case where the number of failures is zero is represented by the symbol "⊚" because the bonding has a sufficient bonding strength. The results are shown in the column "Continuous bonding ability" in Table 2.

In the evaluation of the shape of the bump formed by bonding the ball part on the electrode, 500 bonded bumps were observed to evaluate, for example, the roundness of the shape and the dimensional accuracy. The evaluation was made in two kinds of cases, that is, the case of forming a normal-size ball having a ratio of initial ball diameter/wire diameter of 1.9 to 2.2 and the case of forming a small-diameter ball having a ratio of initial ball diameter/wire diameter of 1.5 to 1.7. If defective ball shapes such as an anisotropic shape deviated from a spherical and a petal form are observed in eight or more bumps, this is rated as a defect and represented by the symbol "×". If defective ball shapes are observed in three to seven bumps, this is represented by the symbol "Δ" because it is desirable to improve according to the need. If defective ball shapes are observed in one or two bumps, this is represented by the symbol "○" because there is no problem. If the number of bumps having defective ball shapes is zero, this is represented by the symbol "⊚" because a good bump shape is obtained. The results are described in the column "Bump shape" in Table 2.

In the evaluation of the bonding strength of the bump bonded on the aluminum electrode, a sample bonded at a low temperature of 170° C. was used. The shear test was carried out for 20 ball bonding parts to measure an average of the shear strengths, thereby calculating the bonding strength per unit area by using an average of the areas of the ball bonding parts, and the calculated bonding strength per unit area was used for evaluation. If the shear strength per unit area is less than 70 MPa, this is represented by the symbol "×" because the bonding strength is not sufficient. If the shear strength is in a range of 70 or more and less than 90 MPa, this is represented by the symbol "Δ" because the shear strength can be improved by a slight change in the bonding condition. If the shear strength is in a range of 90 or more and less than 110 MPa, this is considered to have no practical problem and represented by the symbol "○". If the shear strength is in a range of 110 MPA or more, this is represented by the symbol "⊚" because a high shear strength is obtained. The results are described in the column "Shear strength" in Table 2.

In the evaluation of chip damages, the reverse bonding was performed on the electrode film and then, the electrode film was removed by etching to observe damages to an insulation film or a silicon chip by SEM. 200 electrodes were observed. The case where no damage is observed is represented by the symbol "⊚". The case where cracks of 5 μm or less in size are observed in not more than two electrodes is represented by the symbol "○" because this is not on a problematic level. The case where cracks of 5 μm or more and less than 20 μm in size are observed in two or more electrodes is represented by the symbol "Δ" because this is rated as a level arousing a fear. The case where cracks or crater breaking of 20 μm or more in size are observed in one or more electrons is represented by the symbol "×" because this is rated as a level arousing a fear. The results are described in the column "Chip damages" in Table 2.

With respect to the stability of a loop shape, a trapezoidal loop was formed by two kinds of spans, that is, a general span having a wire length of 2 mm and a short span having a wire length of 0.5 mm. 500 bonding wires were observed in each case by a projector to determine the linearity of the bonding wire, variation in loop height, and the like. The formation of the trapezoidal loop having a short wire length of 0.5 mm requires a stricter loop control to avoid contact with the chip end. In the case where defects such as linearity or loop height failures are observed in five or more bonding wires when the wire length is 2 mm, this is considered problematic and represented by the symbol "×". In the case where defects are observed in two to four bonding wires when the wire length is 2 mm and defects are observed in five or more bonding wires when the wire length is 0.5 mm, this is considered to need to be improved and represented by the symbol "Δ". In the case where defects are observed in not more than one bonding wire when the wire length is 2 mm and defects are observed in two to four bonding wires when the wire length is 0.5 mm, this is represented by the symbol "○" because the loop shape is relatively good. In the case where defects are observed in not more than one bonding wire when the wire length is 0.5 mm, the loop shape is considered to be stable and this case is represented by the symbol "⊚". The results are described in the column "Loop stability" in Table 2.

In order to evaluate the linearity of the loop, bonding was carried out with a general span having a wire length of 2 mm. The wire diameter was set to 20 μm. 30 bonding wires were respectively observed from above by a projector to measure, as the amount of bend, the deviation of the position at which the bonding wire was most apart from the straight line connecting the ball side with the wedge side bonding part. If the average of the amounts of bend is less than one wire diameter, this is rated as good and represented by the symbol "⊚". If the average of the amounts of bend is two or more wire diameters, this is rated as a defect and represented by the symbol "Δ". If the average of the amounts of bend is an intermediate value between the both, this usually poses no problem and is represented by the symbol "○". The results are described in the column "Linearity" in Table 2.

In the evaluation of the strength of the bump/wedge bonding, the second pull test was used. The wire diameter was 25 μm and the span was 2 mm. In this test, a hook catching the loop was moved upward at a position closer to the wedge bonding part (second bonding part) than the position at a distance of ¾ of the wire length to measure the rupture strength of the bonding wire. Because the pull strength was also dependent on the wire diameter of the bonding wire, loop shape and bonding conditions, not an absolute value but a relative ratio (Rp) of pull strength/wire tensile strength was utilized. If Rp is 20% or more, this shows that wedge bonding ability is good and is represented by the symbol "⊚". If Rp is 15% or more and less than 20%, this is considered to have no problem and represented by the symbol "○". If Rp is 10% or more and less than 15%, this is considered to have the possibility that defectives are developed, and represented by the symbol "Δ". If Rp is 10% or more, this poses a problem in a mass-production process and is represented by the symbol "×". The results are described in the column "Second pull strength" in Table 2.

With regard to the evaluation of stripping failures of the wedge bonding part, wire connection was carried out using a bonding wire having a wire diameter of 25 μm at two levels of bonding temperature, that is, 200° C. and 160° C. to observe the stripping conditions of the ends of 300 wires at the bonding part. If significant stripping having a width of 5 μm or more is observed in three or more wires, this is considered to be on a problematic level and represented by the symbol "×". If significant stripping is observed in not more than two wires, this is considered to need to be improved though no problem arises instantly, and represented by the symbol "Δ". If light stripping having a width of about 2 μm or less is observed in four to ten wires though significant stripping is not observed, this is considered to be on no problematic level and represented by the symbol "○". If light eccentricity is observed in not more than three wires, this is considered to be good and represented by the symbol "⊚". The results are described in the column "Stripping" in Table 2.

With regard to the high-temperature reliability of the bonding part, a sample sealed by a resin after bonding was heated at 150° C., 175° C. and 185° C. for 1500 hr and then, the electric characteristics of 40 bonding wires were evaluated. Heating conditions for general IC applications, car IC applications and next generation power IC applications were assumed with respect to the heating operations at 150° C., 175° C. and 185° C., respectively. If the percentage of the bonding wires having the increased electric resistance not less than three times its initial electric resistance is 30%, or more, this is represented by the symbol "×" because of bonding failures. If the percentage of the bonding wires having the increased electric resistance not less than three times is 5% or more and less than 30%, this is represented by the symbol "Δ" because this bonding wire can be used in ICs for which a strict reliability is not required. If the percentage of the bonding wires having the increased electric resistance not less than three times is less than 5% and the percentage of the bonding wires having the increased electric resistance not less than 1.5 times is 10% or more and less than 30%, this is represented by the symbol "○" because this is not a practical problem. If the percentage of the bonding wires having the increased electric resistance not less than 1.5 times is less than 10%, this is represented by the symbol "⊚" because the bonding is good. The results are described in the column "High-temperature heating test" in Table 2.

In the TCT test, a commercially available TCT tester was used. In temperature history, two kinds of conditions, that is, a standard condition (−55° C./30 min to 125° C./30 min) in a severe environment and an extremely severe condition (−55° C./30 min to 155° C./30 min) were adopted. After the test was finished, electrical measurement was made to evaluate the electrical conduction. 400 wires were measured. If the percentage defective is zero, this is represented by the symbol "⊚" because high reliability is obtained. If the percentage defective is 1% or less, this is considered to have no practically large problem and represented by the symbol "○". If the percentage defective is in a range from 2 to 5%, this is represented by the symbol "Δ". If the percentage defective exceeds 5%, this need to be improved, and is represented by the symbol "×". The results are described in the column "TCT test" in Table 2.

In the evaluation of the reflow resistance, the wire bonding and a resin-sealed semiconductor sample were kept at 260° C. for 10 seconds in a reflow furnace and then cooled to a normal temperature. This heat history was repeated ten times. Evaluation was made using two kinds of samples differing in wire bonding temperature condition, that is, a sample in which the bonding wire was connected at 200° C. which was an ordinary temperature and a sample in which the bonding wire was connected at a low temperature of 160° C. which was a severe condition. After the reflow test, electrical measurement was made to evaluate the electrical conduction. 400 wires were measured. If the percentage defective is zero, this is represented by the symbol "⊚" because high reliability is obtained. If the percentage defective is 1% or less, this is considered to have no practically large problem and represented by the symbol "○". If the percentage defective is in a range from 2 to 5%, this is represented by the symbol "Δ". If the percentage defective exceeds 5%, this need to be improved, and is represented by the symbol "×". The results are described in the column "Reflow test" in Table 2.

In the PCT test (pressure cooker test), a sample was heated in a high-temperature and high-humidity environment at 121° C. under 2 atmospheres and a humidity of 100% for 400 hr. Then, the electric characteristics of 40 bonding wires were evaluated. If the percentage of the bonding wires having the increased electric resistance not less than three times its initial electric resistance is 30% or more, this is represented by the symbol "×" because of bonding failures. If the percentage of the bonding wires having the increased electric resistance not less than three times is 5% or more and less than 30%, this is represented by the symbol "Δ" because this bonding wire can be used in ICs for which strict reliability is not required. If the percentage of the bonding wires having the increased electric resistance not less than three times is less than 5% and the percentage of the bonding wires having the increased electric resistance not less than 1.5 times is 10% or more and less than 30%, this is represented by the symbol "○" because this is not a practical problem. If the percentage of the bonding wires having the increased electric resistance not less than 1.5 times is less than 10%, this is represented by the symbol "⊚" because the bonding is good. The results are described in the column "PCT test" in Table 2.

In the high-temperature and high-humidity bias test (HAST test), a commercially available HAST tester was used. A sample was heated in a heating condition of 130° C. and a humidity of 85% RH under a constant voltage for 200 hr or 400 hr. Then, the electric characteristics of 40 bonding wires were evaluated. If the percentage of the bonding wires having the increased electric resistance not less than three times its initial electric resistance is 30% or more, this is represented by the symbol "×" because of bonding failures. If the percentage of the bonding wires having the increased electric resistance not less than three times is 5% or more and less than 30%, this is represented by the symbol "Δ" because this bonding wire can be used in ICs for which strict reliability is not required. If the percentage of the bonding wires having the increased electric resistance not less than three times is less than 5% and the percentage of the bonding wires having the increased electric resistance not less than 1.5 times is 10% or more and less than 30%, this is represented by the symbol "○" because this is not a practical problem. If the percentage of the bonding wires having the increased electric resistance not less than 1.5 times is less than 10%, this is represented by the symbol "⊚" because the bonding is good. The results are described in the column "HAST test" in Table 2.

In the evaluation of the high-speed bonding ability, wire bonding was carried out at a rate higher by 20% than the ordinary condition suitable for the mass-production to evaluate the bonding ability by, for example, the number of stops of the bonding apparatus and disorders of a loop shape and a bonding part shape. The evaluation was made with respect to the wire diameter of 25 μm, the span of 4 mm and the connections of 10000 wires. The case where the number of stops of the bonding apparatus was two or more is represented by the symbol "×", and the case where the number of stops was one is represented by the symbol "Δ". The case where variations in a loop shape and a bonding part shape observed though the number of stops was zero is represented by the symbol "○". The case where the number of stops is zero and the loop shape and the bonding part shape are stable is represented by the symbol "⊚", because the bonding is good. The results are described in the column "High-speed bonding ability" in Table 3.

In the evaluation of the life of the capillary, after the wire bonding of 100,000 bonding wires was performed, the contamination, attachments, abrasion and the like of the end of the capillary were observed by an optical microscope. The wire diameter and the span were set to 25 μm and 4 mm, respectively. For an accelerated test, the conditions of the reverse action of loop formation, bonding load, ultrasonic wave and the like were made heavier than the ordinary conditions. The case where the abrasion of the end of the capillary is observed is represented by the symbol "×", and the case where significant attachments are observed though no abrasion is observed is represented by the symbol "Δ". The case where the ratio of attachments is 20% or less of the area of the end of the capillary is considered to be relatively good and represented by the symbol "○". The case where neither attachment nor contamination is observed is represented by the symbol "⊚", because the bonding is good. The results are described in the column "Life of capillary" in Table 3.

In the evaluation of scratching on the surface of the wire, the examinations of scratching were made by observing the appearance of the bonded loop. A trapezoidal loop having a wire diameter of 25 μm, a wire length of 4 mm and an intended height of 100 to 250 μm was formed. 1000 wires in each example were observed by an optical microscope. Scratches of 10 μm or more in size were counted. The case where the scratches are observed in 10 or more wires is considered problematic and represented by the symbol "×". The case where the scratches are observed in three to nine wires is considered to need to be improved and represented by the symbol "Δ". The case where the scratches are observed in one or two wires is represented by the symbol "○" because the surface of the wire is relatively good. The case where the number of the scratches is zero is considered to be stable and good, and represented by the symbol "⊚". The results are described in the column "Scratches on the surface of the loop" in Table 3.

In the evaluation of the shape of the bump, after the wedge bonding was performed on the bump, the shapes of 200 bumps were observed to evaluate the roundness of the shape. The wire diameter was set to 25 μm. A ball having an ordinary size and an initial ball diameter/wire diameter ratio of 1.9 to 2.2 was formed. If defective ball shapes such as anisotropic shapes deviated from a spherical and a petal form are observed in 10 or more bumps, this is rated as defect and represented by the symbol "×". If defective ball shapes are observed in four to nine bumps, this is represented by the symbol "Δ" because it is desirable to improve according to the need. If defective ball shapes are observed in one to three bumps, this is represented by the symbol "○" because there is no problem. If no defective shape is observed in any bump, this is represented by the symbol "⊚" because a good bump shape is obtained. The results are described in the column "Bump shape" in Table 3.

In the evaluation of the peeling strength of the wedge bonding part, the pull test was used. The wire diameter was 25 μm and the span was 4 mm. A hook catching the loop was moved upward at a position closer to the wedge bonding part than the position at a distance of ¾ of the wire length to measure the rupture strength of the wire. Because the pull strength is also dependent on the wire diameter of the wire, loop shape, bonding conditions and the like, not an absolute value but a relative ratio (Rp) of pull strength/wire tensile strength was utilized. If Rp is 20% or more, this shows that wedge bonding ability are good and is represented by the symbol "⊚". If Rp is 15% or more and less than 20%, this is considered to have no problem and represented by the symbol "○". If Rp is 10% or more and less than 15%, this is considered to have the possibility that defectives are developed, and represented by the symbol "Δ". If Rp is less than 10%, this poses a problem in a mass-production process and is represented by the symbol "×". The results are described in the column "Peeling strength of the wedge bonding part" in Table 3.

For example, point analysis and line analysis by means of, primarily, EPMA, EDX and AES were made for the surface analysis of the ball bonding part of the bonding wire and analysis of the concentration of the bonding part interface of the bonding wire. The analysis was made in an area of 0.1 μm or more in diameter to utilize, for example, the maximum concentration or an average concentration. Processes, histories, etc. after the ball was bonded were diversified in the production and use of an actual semiconductor. Therefore, several samples differing in process, heat history, etc. were analyzed. For example, treated samples were used which were obtained just after the ball bonding, after the resin sealing and the cure heating, after the heating test, etc., and after the reliability evaluation test. Also, in the case of observing the concentrated layer B after the accelerated heat treatment, a semiconductor device was heated at 175° C. for 200 hr, followed by examination by the above analytical technique.

TABLE 1

| | | | Bump/wedge bonding | | | | |
| | | | Increased concentration of metal R in concentrated layer A | | | Increased concentration of oxygen at junction interface | |
| | Test No. | Metal R | Concentration increasing ratio (ratio to concentration in ball) | Thickness of region having concentration of 10 mol % or more/μm | Thickness of region having concentration of 50 mol % or more/μm | Thickness of region having concentration of 10 mol % or more/μm | Thickness of region having concentration of 20 mol % or more/μm |
| --- | --- | --- | --- | --- | --- | --- | --- |
| Examples of the present invention | 1 | Pd | 18 | 0.005 | <0.0008 | 0.01 | 0 |
| | 2 | Pd | 86 | 0.015 | 0.003 | 0.01 | 0.005 |
| | 3 | Pd | 250 | 0.02 | 0.006 | 0.003 | 0 |
| | 4 | Pd | 1380 | 0.05 | 0.01 | 0.015 | 0.008 |
| | 5 | Pd | 4800 | 0.08 | 0.03 | 0.001 | 0 |
| | 6 | Pd | 9930 | 0.15 | 0.04 | 0.03 | 0.003 |
| | 7 | Pd | 12870 | 0.2 | 0.05 | 0.002 | 0 |
| | 8 | Pd | 4310 | 0.8 | 0.04 | 0.04 | 0.02 |
| | 9 | Pd | 14880 | 1.3 | 0.13 | 0.003 | 0 |
| | 10 | Pd | 12460 | 0.5 | 0.25 | 0.03 | 0.005 |
| | 11 | Pd | 810 | 5.2 | 1.1 | 0.03 | 0.01 |
| | 12 | Pd | 2530 | 0.03 | 0.03 | 0.045 | 0.04 |

TABLE 1-continued

|  | Test No. | | | | | |
|---|---|---|---|---|---|---|
|  | 13 | Pd | 8820 | 0.05 | 0.04 | 0.07 | 0.05 |
|  | 14 | Pd | 830 | 0.12 | 0.03 | 0.01 | 0.003 |
|  | 15 | Pd | 8610 | 0.06 | 0.04 | 0.005 | 0 |
|  | 16 | Pd | 5200 | 0.06 | 0.02 | 0.01 | 0 |
|  | 17 | Pd | 2750 | 0.02 | 0.01 | 0.02 | 0.003 |
|  | 18 | Pd | 5350 | 0.04 | 0.02 | 0.01 | 0 |
|  | 19 | Pd | 9320 | 0.03 | 0.01 | 0.005 | 0.003 |
|  | 20 | Au | 4300 | 0.008 | 0.003 | 0.02 | 0.01 |
|  | 21 | Au | 6200 | 0.04 | 0.01 | 0.01 | 0.005 |
|  | 22 | Au | 9170 | 0.4 | 0.1 | 0.003 | 0 |
|  | 23 | Pt | 5390 | 0.04 | 0.03 | 0.01 | 0.005 |
|  | 24 | Ag | 310 | 0.15 | 0.08 | 0.03 | 0.02 |
|  | 25 | Rh | 3140 | 0.03 | 0.02 | 0.05 | 0.04 |
|  | 26 | Pd, Au | 870 | 0.01 | 0.004 | 0.007 | 0.002 |
|  | 27 | Pd, Au | 8120 | 0.14 | 0.08 | 0.02 | 0.01 |
|  | 28 | Pd, Pt | 4220 | 0.04 | 0.02 | 0.01 | 0 |
|  | 29 | Pd | 12 | 0.02 | 0.01 | 0.02 | 0.01 |
|  | 30 | Au | 11 | 0.01 | 0.003 | 0.03 | 0.02 |
| Comparative examples | 1 | — | — | — | — | 0.1 | 0.06 |
|  | 2 | — | — | — | — | 0.02 | 0.01 |
|  | 3 | Pd | 3 | 0 | 0 | 0.03 | 0.01 |
|  | 4 | Pd | 5 | 0 | 0 | 0.08 | 0.04 |
|  | 5 | Au | 5 | 0.01 | 0.002 | 0.02 | 0.005 |
|  | 6 | Pt | 23 | 0.04 | 0.01 | 0.03 | 0.01 |
|  | 7 | Pd | 7 | 0.01 | 0.003 | 0.01 | 0.003 |
|  | 8 | Pd, Au | 6 | 0 | 0 | 0.02 | 0.01 |

|  | | | Electrode/bump bonding | | | | |
|---|---|---|---|---|---|---|---|
|  | | | Increased concentration of metal R in concentrated layer B | | | In case where diffusion layer and intermetallic compound contain concentrated layer B | Ratio of thicknesses of concentrated layers A and B when concentration of each layer is 50 mol % |
|  | Test No. | Metal R | Concentration increasing ratio (ratio to concentration in ball) | Thickness of region having concentration of 3 mol % or more/μm | Thickness of region having concentration of 10 mol % or more/μm | | |
| Examples of the present invention | 1 | Pd | 8 | 0.008 | 0.004 | X | 2.3 |
|  | 2 | Pd | 33 | 0.05 | 0.02 | X | 2.6 |
|  | 3 | Pd | 37 | 0.01 | 0.003 | X | 6.8 |
|  | 4 | Pd | 455 | 0.03 | 0.01 | ○ | 3.0 |
|  | 5 | Pd | 760 | 0.08 | 0.02 | ○ | 6.3 |
|  | 6 | Pd | 810 | 0.1 | 0.7 | ○ | 12.3 |
|  | 7 | Pd | 2650 | 0.1 | 0.08 | ○ | 4.9 |
|  | 8 | Pd | 1820 | 0.2 | 0.1 | ○ | 2.4 |
|  | 9 | Pd | 1250 | 0.6 | 0.2 | ○ | 11.9 |
|  | 10 | Pd | 1630 | 1 | 0.4 | ○ | 7.6 |
|  | 11 | Pd | 930 | 0.8 | 0.7 | ○ | 0.9 |
|  | 12 | Pd | 350 | 0.2 | 0.05 | ○ | 7.2 |
|  | 13 | Pd | 1260 | 0.1 | 0.03 | ○ | 7.0 |
|  | 14 | Pd | 7 | 0.1 | 0.003 | X | 118.6 |
|  | 15 | Pd | 380 | 0.05 | 0.02 | ○ | 22.7 |
|  | 16 | Pd | 28 | 0.008 | 0.002 | X | 185.7 |
|  | 17 | Pd | 115 | 0.02 | 0.004 | X | 23.9 |
|  | 18 | Pd | 1560 | 0.1 | 0.05 | ○ | 3.4 |
|  | 19 | Pd | 1230 | 0.4 | 0.3 | ○ | 7.6 |
|  | 20 | Au | 3200 | 0.2 | 0.1 | ○ | 1.3 |
|  | 21 | Au | 1040 | 0.7 | 0.4 | ○ | 6.0 |
|  | 22 | Au | 2020 | 1 | 0.7 | ○ | 4.5 |
|  | 23 | Pt | 1240 | 0.1 | 0.03 | ○ | 4.3 |
|  | 24 | Ag | 83 | 0.3 | 0.2 | ○ | 3.7 |
|  | 25 | Rh | 34 | 0.008 | 0.004 | X | 92.4 |
|  | 26 | Pd, Au | 1260 | 0.2 | 0.1 | ○ | 0.7 |
|  | 27 | Pd, Au | 1240 | 0.5 | 0.2 | ○ | 6.5 |
|  | 28 | Pd, Pt | 690 | 0.1 | 0.03 | ○ | 6.1 |
|  | 29 | Pd | 3 | 0.2 | 0.004 | X | 4.0 |
|  | 30 | Au | 12 | 0.2 | 0.1 | X | 0.9 |
| Comparative examples | 1 | — | — | — | — | — | — |
|  | 2 | — | — | — | — | — | — |
|  | 3 | Pd | 2 | 0.02 | 0 | X | 1.5 |
|  | 4 | Pd | 3 | 0.4 | 0.2 | ○ | 1.7 |
|  | 5 | Au | 120 | 0.1 | 0.05 | ○ | 0.04 |
|  | 6 | Pt | 4 | 0.02 | 0 | X | 5.8 |
|  | 7 | Pd | 2 | 0.03 | 0.02 | ○ | 3.5 |
|  | 8 | Pd, Au | 4 | 0.05 | 0.01 | X | 1.5 |

TABLE 1-continued

|  | Test No. | Metal R | Concentrated layer C on surface of bump and wire | | Thickness of region where concentration is 0.5 mol % or more on surface of bump/ μm | Copper wire | | |
|---|---|---|---|---|---|---|---|---|
|  |  |  | Area ratio of concentrated layer C | | | Outer skin layer (described from outermost surface) | | |
|  |  |  | Surface of bump (%) | Surface of wire (%) |  | Major component(s) | Layer thickness/ μm | Core material |
| Examples of the present invention | 1 | Pd | 43 | 33 | 0.02 | Pd | 0.001 | Cu |
|  | 2 | Pd | 52 | 28 | 1 | Pd | 0.01 | Cu |
|  | 3 | Pd | 65 | 54 | 2 | Pd | 0.03 | Cu |
|  | 4 | Pd | 70 | 63 | 3 | Pd | 0.05 | Cu alloy 1 |
|  | 5 | Pd | 82 | 45 | 4 | Pd | 0.05 | Cu |
|  | 6 | Pd | 90 | 73 | 6 | Pd | 0.08 | Cu |
|  | 7 | Pd | 88 | 63 | 8 | Pd | 0.1 | Cu |
|  | 8 | Pd | 90 | 43 | 15 | Pd | 0.3 | Cu alloy 4 |
|  | 9 | Pd | 98 | 92 | 18 | Pd | 1.05 | Cu |
|  | 10 | Pd | 78 | 38 | 12 | Pd | 0.7 | Cu |
|  | 11 | Pd | 89 | 52 | 25 | Pd | 1.1 | Cu |
|  | 12 | Pd | 80 | 65 | 3 | Pd | 0.04 | Cu alloy 3 |
|  | 13 | Pd | 80 | 42 | 5 | Pd | 0.06 | Cu |
|  | 14 | Pd | 76 | 73 | 8 | Pd | 0.05 | Cu |
|  | 15 | Pd | 88 | 93 | 11 | Pd | 0.1 | Cu alloy 4 |
|  | 16 | Pd | 83 | 77 | 10 | Pd | 0.08 | Cu |
|  | 17 | Pd | 85 | 68 | 5 | Pd | 0.03 | Cu alloy 1 |
|  | 18 | Pd | 52 | 25 | 7 | Pd | 0.05 | Cu |
|  | 19 | Pd | 35 | 20 | 6 | Pd | 0.07 | Cu |
|  | 20 | Au | 42 | 28 | 1 | Au | 0.01 | Cu |
|  | 21 | Au | 78 | 56 | 5 | Au | 0.05 | Cu alloy 2 |
|  | 22 | Au | 82 | 72 | 10 | Au | 0.3 | Cu |
|  | 23 | Pt | 62 | 48 | 6 | Pt | 0.07 | Cu alloy 3 |
|  | 24 | Ag | 38 | 42 | 22 | Ag | 0.1 | Cu |
|  | 25 | Rh | 55 | 36 | 0.04 | Rh | 0.05 | Cu |
|  | 26 | Pd, Au | 68 | 43 | 3 | Pd0.03/Au0.02 | | Cu alloy 2 |
|  | 27 | Pd, Au | 92 | 62 | 12 | Pd0.1/Au0.04 | | Cu |
|  | 28 | Pd, Pt | 73 | 53 | 2 | Pd0.03/Pt0.02 | | Cu |
|  | 29 | Pd | 44 | 32 | 27 | Monolayer Cu + Pd1% | | |
|  | 30 | Au | 25 | 28 | 2 | Monolayer Cu + Au0.1% | | |
| Comparative examples | 1 | — | — | — | — | — | — | Cu |
|  | 2 | — | — | — | — | — | — | Cu alloy 1 |
|  | 3 | Pd | 35 | 12 | 0.2 | Pd | 0.0007 | Cu |
|  | 4 | Pd | 56 | 33 | 2 | Pd | 0.02 | Cu alloy 2 |
|  | 5 | Au | 32 | 22 | 7 | Au | 0.01 | Cu |
|  | 6 | Pt | 38 | 34 | 3 | Pt | 0.01 | Cu alloy 3 |
|  | 7 | Pd | 45 | 35 | 3 | Pd | 0.01 | Cu |
|  | 8 | Pd, Au | 55 | 42 | 2 | Pd0.001/Au0.000 | | Cu |

TABLE 2

| | | Continuous bonding ability | | | | | | | | | | | | | | Reliability test | | | | | | |
|---|---|---|---|---|---|---|---|---|---|---|---|---|---|---|---|---|---|---|---|---|---|---|---|
| | | Non-stick failure | | | Short tail | | Shear strength | Chip damages | Bump shape | Loop stability | Linearity | Second pull strength | Stripping | PCT test | High-temperature heating test: 2000 hr | | | TCT test | Reflow test Bonding temperature | | HAST test Heating time | |
| | | Wire diameter: 25 μm | | | 25 μmφ | | | | | | | | | | | | | | | | | | |
| | Test No. | pitch: 80 μm | 65 μm | 20 μm | 50 μm | 18 μm | 80 μm | | | | | | | | | | 150° C. | 175° C. | 185° C. | | 200° C. | 160° C. | 200 hr | 400 hr |
| Examples of the present invention | 1 | ○ | ○ | ○ | ○ | △ | ○ | ○ | ○ | ◎ | ○ | ○ | ◎ | ○ | ◎ | ○ | △ | △ | ◎ | ○ | △ | ○ | ○ |
| | 2 | ◎ | ◎ | ◎ | ◎ | ○ | ◎ | ◎ | ◎ | ◎ | ◎ | ◎ | ◎ | ◎ | ◎ | ◎ | ◎ | ○ | ◎ | ◎ | △ | ◎ | ○ |
| | 3 | ◎ | ◎ | ◎ | ◎ | ◎ | ◎ | ◎ | ◎ | ◎ | ◎ | ◎ | ◎ | ◎ | ◎ | ◎ | ◎ | ○ | ◎ | ◎ | ◎ | ◎ | ◎ |
| | 4 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 5 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 6 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 7 | ◎ | ◎ | ◎ | ◎ | ◎ | ◎ | ◎ | ◎ | ◎ | ◎ | ◎ | ◎ | ◎ | ◎ | ◎ | ○ | ○ | ◎ | ◎ | △ | ◎ | ◎ |
| | 8 | ◎ | ◎ | ◎ | ◎ | ◎ | ◎ | ◎ | ◎ | ◎ | ◎ | ◎ | ◎ | ◎ | ◎ | ◎ | ◎ | ○ | ◎ | ◎ | ◎ | ◎ | ◎ |
| | 9 | ◎ | ◎ | ◎ | ◎ | ◎ | ◎ | ◎ | ◎ | ◎ | ◎ | ◎ | ◎ | ◎ | ◎ | ◎ | ◎ | △ | ◎ | ◎ | △ | ◎ | ◎ |
| | 10 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 11 | ○ | ◎ | ◎ | ◎ | ○ | ◎ | ○ | ◎ | ○ | ◎ | ◎ | ◎ | ◎ | ◎ | ◎ | ◎ | ◎ | ◎ | ◎ | ◎ | ◎ | ◎ |
| | 12 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 13 | ◎ | ◎ | ◎ | ◎ | ◎ | ◎ | ◎ | ◎ | ◎ | ◎ | ◎ | ◎ | ◎ | ◎ | ◎ | ◎ | △ | △ | ◎ | △ | ◎ | ◎ |
| | 14 | ◎ | ◎ | ◎ | ◎ | ◎ | ◎ | ◎ | ◎ | ◎ | ◎ | ◎ | ◎ | ◎ | ◎ | ◎ | ○ | ◎ | ◎ | ◎ | ○ | ◎ | ◎ |
| | 15 | ◎ | ◎ | ◎ | ◎ | ◎ | ◎ | ◎ | ◎ | ◎ | ◎ | ◎ | ◎ | ◎ | ◎ | ◎ | ○ | ◎ | ◎ | ◎ | ◎ | ◎ | ◎ |
| | 16 | ◎ | ◎ | ◎ | ◎ | ◎ | ◎ | ◎ | ◎ | ◎ | ◎ | ◎ | ◎ | ◎ | ◎ | ◎ | ◎ | △ | △ | ◎ | △ | ◎ | ◎ |
| | 17 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 18 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 19 | ◎ | ◎ | ◎ | ◎ | ◎ | ◎ | ◎ | ◎ | ◎ | △ | ◎ | △ | ◎ | ◎ | ◎ | ◎ | △ | ◎ | ◎ | △ | ◎ | ◎ |
| | 20 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 21 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ |
| | 22 | ◎ | ◎ | ◎ | ◎ | ◎ | ◎ | ◎ | ◎ | ◎ | ◎ | ◎ | ◎ | ◎ | ◎ | ◎ | ◎ | △ | △ | ◎ | △ | ◎ | ◎ |
| | 23 | ◎ | ◎ | ◎ | ◎ | ◎ | ◎ | ◎ | ◎ | ◎ | △ | ◎ | ◎ | ◎ | ◎ | ◎ | ◎ | ◎ | ◎ | ◎ | ◎ | ◎ | ◎ |
| | 24 | ◎ | ◎ | ◎ | ◎ | ◎ | ◎ | ◎ | ◎ | ○ | △ | ○ | ◎ | ◎ | ◎ | ◎ | ○ | ○ | ◎ | ◎ | ○ | ◎ | ○ |
| | 25 | ◎ | ◎ | ◎ | ◎ | ◎ | ◎ | ◎ | ◎ | ○ | △ | ○ | ◎ | ◎ | ◎ | ◎ | ○ | ○ | ◎ | ○ | ○ | ◎ | ○ |
| | 26 | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | ◎ | △ | ◎ | ◎ |
| | 27 | ○ | ◎ | ◎ | ○ | ○ | ○ | ○ | ◎ | ○ | ○ | ○ | ◎ | ○ | ○ | ○ | ○ | ○ | ○ | ○ | ○ | ○ | ○ |
| | 28 | ◎ | ◎ | ◎ | ◎ | ◎ | ◎ | ◎ | ◎ | ◎ | △ | ◎ | ◎ | ◎ | ◎ | ◎ | ○ | △ | ◎ | ◎ | △ | ◎ | △ |
| | 29 | ○ | ○ | ○ | ○ | ○ | ○ | ○ | ○ | ○ | ○ | ○ | ◎ | ○ | ○ | ○ | ○ | ○ | ○ | ○ | ○ | ○ | ○ |
| | 30 | ◎ | ◎ | ◎ | ◎ | ◎ | ◎ | ◎ | ◎ | ◎ | △ | △ | △ | △ | ○ | ◎ | ◎ | ◎ | ◎ | ◎ | △ | ◎ | △ |
| Comparative examples | 1 | × | × | × | × | × | × | △ | △ | × | × | × | × | × | × | × | × | × | × | × | × | × | × |
| | 2 | × | × | × | × | × | × | △ | △ | × | × | × | × | × | × | × | ○ | × | × | × | × | × | × |
| | 3 | × | × | × | × | × | × | × | × | ○ | △ | △ | ○ | × | × | ○ | △ | ○ | ○ | △ | × | × | △ |
| | 4 | × | × | × | × | × | × | △ | △ | ○ | △ | ○ | ○ | × | × | ○ | ○ | △ | × | △ | × | × | × |
| | 5 | △ | × | × | × | × | △ | △ | × | △ | △ | ○ | ○ | × | × | ○ | △ | △ | ○ | △ | × | × | △ |
| | 6 | × | × | × | × | × | × | △ | × | ○ | △ | △ | ○ | × | × | ○ | ○ | △ | ○ | △ | × | × | × |
| | 7 | × | × | × | × | × | × | × | × | × | △ | △ | ○ | × | × | ○ | △ | △ | ○ | △ | × | △ | △ |
| | 8 | × | × | × | × | × | × | × | × | ○ | △ | △ | ○ | × | × | ○ | △ | × | ○ | △ | × | △ | △ |

TABLE 3

Bump/wedge bonding
Increased concentration of metal R in concentrated layer A

| Test No. | Metal R | Concentration increasing ratio (ratio to concentration in ball) | Concentration ratio: (Ag + Au) concentration/Pd concentration | Pd alloy region Maximum concentration of Ag or Au/mol % | Thickness/nm | Highly-concentrated Pd region Maximum concentration of Pd/mol % | Thickness/nm |
|---|---|---|---|---|---|---|---|
| 31 | Pd, Au | 15 | 1% | 25 | 3 | 100 | 10 |
| 32 | Pd, Au | 125 | 75% | 30 | 12 | 95 | 16 |
| 33 | Pd, Au | 520 | 78% | 48 | 20 | 80 | 45 |
| 34 | Pd, Au | 810 | 97% | 60 | 40 | 85 | 90 |
| 35 | Pd, Ag | 20 | 0.5% | 13 | 3 | 100 | 4 |
| 36 | Pd, Ag | 75 | 5% | 45 | 20 | 93 | 60 |
| 37 | Pd, Ag | 740 | 70% | 60 | 38 | 82 | 100 |
| 38 | Ag | 120 | — | 100 | 15 | — | — |
| 39 | Au | 750 | — | 100 | 42 | — | — |
| 40 | Pd | 85 | — | — | — | 100 | 47 |

| Test No. | Metal R | Electrode/Bump bonding Concentration increasing ratio of metal R (ratio to concentration in ball) in concentrated layer B | Copper Wire Outer skin layer (described in order of outermost surface and second layer) Outermost surface | Second layer | Layer thickness/μm | Ratio of thickness of outermost layer to thickness of second layer | Core material |
|---|---|---|---|---|---|---|---|
| 31 | Pd, Au | 15 | PdAu alloy | Pd | 0.01 | 15% | Cu |
| 32 | Pd, Au | 30 | PdAu alloy | Pd | 0.05 | 60% | Cu |
| 33 | Pd, Au | 150 | PdAu alloy | Pd | 0.08 | 4% | Cu |
| 34 | Pd, Au | 980 | PdAu alloy | Pd | 0.15 | 15% | Cu alloy1 |
| 35 | Pd, Ag | 35 | PdAg alloy | Pd | 0.02 | 2% | Cu |
| 36 | Pd, Ag | 120 | PdAg alloy | Pd | 0.07 | 15% | Cu |
| 37 | Pd, Ag | 2500 | PdAg alloy | Pd | 0.12 | 50% | Cu alloy2 |
| 38 | Ag | 150 | Ag | — | 0.02 | — | Cu |
| 39 | Au | 450 | Au | — | 0.04 | — | Cu alloy3 |
| 40 | Pd | 75 | Pd | — | 0.06 | — | Cu |

| Test No. | Metal R | Continuous bonding ability Non-stick failure Wire diameter: 25 μm pitch: 80 μm | Short tail 25 μmφ 80 μm | Shear strength | High-speed bonding ability | Life of capillary | Scratches on surface of loop | Bump shape | Peeling strength of wedge bonding part |
|---|---|---|---|---|---|---|---|---|---|
| 31 | Pd, Au | ◉ | ◉ | ◉ | ◉ | ◉ | ◉ | ◉ | ◉ |
| 32 | Pd, Au | ◉ | ◉ | ◉ | ◉ | ◉ | ◉ | ◉ | ◉ |
| 33 | Pd, Au | ◉ | ◉ | ◉ | ◉ | ◉ | ◉ | ◉ | ◉ |
| 34 | Pd, Au | ◉ | ◉ | ◉ | ◉ | ◉ | ◉ | ◉ | ◉ |
| 35 | Pd, Ag | ◉ | ◉ | ◉ | ◉ | ◉ | ◉ | ◉ | ◉ |
| 36 | Pd, Ag | ◉ | ◉ | ◉ | ◉ | ◉ | ◉ | ◉ | ◉ |
| 37 | Pd, Ag | ◉ | ◉ | ◉ | ◉ | ◉ | ◉ | ◉ | ◉ |
| 38 | Ag | ◉ | ◉ | ○ | Δ | Δ | ○ | ○ | ○ |
| 39 | Au | ◉ | ◉ | ◉ | Δ | Δ | ○ | ○ | ○ |
| 40 | Pd | ◉ | ◉ | ○ | Δ | Δ | Δ | ○ | ○ |

Tables 1, 2 and 3 show the results of evaluation of the copper-based bonding wire according to the present invention and comparative examples.

The bonding structure according to claim 1 is embodied in Examples 2 to 13, 15 to 28 and 30 to 40; the bonding structure according to claim 2 is embodied in Examples 2 to 10, 12, 13, 15 to 19, 21 to 28 and 30; the bonding structure according to claim 3 is embodied in Examples 3 to 10, 12, 13, 15 to 19, 21 to 25, 27 and 28; the bonding structure according to claim 4 is embodied in Examples 2 to 13, 15, 17 to 24, 26 to 28 and 30; the bonding structure according to claim 5 is embodied in Examples 4 to 13, 15, 18 to 24 and 26 to 28; the bonding structure according to claim 6 is embodied in Examples 3 to 7, 9, 10, 12, 13, 15 to 19, 21 to 25, 27 and 28; the bonding structure according to claim 7 is embodied in Examples 3 to 13, 15 to 17, 21 to 23 and 25 to 28; the bonding structure according to claim 8 is embodied in Examples 1, 3 to 17, 21 to 23 and 25 to 29; the bonding structure according to claim 9 is embodied in Examples 3 to 10, 12 to 17, 21 to 23 and 25 to 29; the bonding structure according to claim 10 is embodied in Examples 3 to 10, 12 to 17, 21 to 23, 25 and 27 to 29; the bonding structure according to claim 11 is embodied in Examples 3 to 10, 12 to 17, 21 to 23 and 26 to 28; the bonding structure according to claim 12 is embodied in Examples 1 to 23 and 26 to 30; the bonding structure according to claim 13 is embodied in Examples 31 to 37; the bonding structure according to claim 14 is embodied in Examples 31 to 37; the bonding structure according to claim 15 is embodied in Examples 1 to 12 and 14 to 30; the bonding structure according to claim 16 is embodied in Examples 1 to 28; the bonding structure according to claim 17 is embodied in Examples 1 to 23 and 26 to 28; and the bonding structure according to claim 18 is embodied in Examples 2 to 8, 10 and 12 to 28. Comparative Examples 1 to 8 show the results that any of claims 1 and 8 is not sufficient.

As the description of "Core material" of the column "Copper wire" in Table 1, the core material is described as "Cu" when it is a high-purity copper having a purity of 4N or more. Also, copper alloys are described as follows: "Cu alloy 1" when P (0.004 mol %) and La (0.001 mol %) are contained, "Cu alloy 2" when Bi (0.005 mol %) and Ag (0.01 mol %) are contained, "Cu alloy 3" when Ir (0.0005 mol %) and Zr (0.001 mol %) are contained and "Cu alloy 4" when Ag (0.0002 mol %) and B (0.0007 mol %) are contained.

With regard to typical examples which embody each claim, a part of the evaluation results will be described.

Examples 2 to 13, 15 to 28 and 30 each represent a bonding structure formed by connecting a bonding wire onto a ball bump formed on an electrode of a semiconductor device according to the present invention, the bonding wire and the ball bump each containing copper as its major component, the bonding structure comprising a concentrated layer A in which the concentration of a metal R other than copper is not less than ten times the average concentration of the metal R in the ball bump, the concentrated layer A being provided at the interface of the bump/wedge bonding part, and a concentrated layer B in which the concentration of a metal R is not less than ten times the average concentration of the metal R in the ball bump, the concentrated layer B being provided at the interface of the electrode/bump bonding part. It has been confirmed that according to this structure, continuous bonding ability can be improved in reverse bonding using a bonding wire having a wire diameter of 25 μm at an electrode pitch of 80 μm. In comparative Examples 1 to 8, on the other hand, continuous bonding ability of the reverse bonding is deteriorated because these comparative examples satisfy none of the requirements of the concentrated layers A and B described above. It has been confirmed that, in Examples 3 to 13 and 15 to 28, a high effect on the ability to inhibit short-tail failures at the bump/wedge bonding part is obtained because the concentration ratio of the metal R of the concentrated layer A to that in the ball bump is preferably 100 or more. Also in Examples 4 to 13, 15, 17 to 24 and 26 to 28, it has been confirmed that a high effect of increasing shear strength and to reduce chip damages because the concentration ratio of the metal R in the concentrated layer B to that in the ball bump is preferably 50 or more.

In Examples 2 to 10, 12, 13, 15 to 19, 21 to 28 and 30, the concentrated layers A and B according to the present invention are formed wherein the thickness of the region in the concentrated layer A where the concentration of the metal R is 10 mol % or more is in a range from 0.01 to 5 μm. It has been therefore confirmed that this structure improves continuous bonding ability in reverse bonding using a bonding wire having a wire diameter of 20 μm at a pitch of 65 μm.

In Examples 3 to 10, 12, 13, 15 to 19, 21 to 25, 27 and 28, the concentrated layers A and B according to the present invention are formed wherein the thickness of the region in the concentrated layer A where the concentration of the metal R is 50 mol % or more is in a range from 0.005 to 1 μm. It has been therefore confirmed that this structure improves continuous bonding ability in reverse bonding using a bonding wire having a wire diameter of 18 μm at a pitch of 50 μm.

In Examples 2 to 13, 15, 17 to 24, 26 to 28 and 30, the thickness of the region in the concentrated layer B according to the present invention where the concentration of the metal R is 3 mol % or more is in a range from 0.01 to 5 μm. It has been therefore confirmed that the high-temperature reliability at a heating temperature of 150° C. is thereby improved. Preferably, in Examples 2, 4 to 13, 15, 18 to 24, 26 to 28 and 30, the thickness of the region in the concentrated layer B where the concentration of the metal R is 10 mol % or more is in a range from 0.005 to 2 μm. It has been therefore confirmed that this structure has a high effect of improving the high-temperature reliability at a higher heating temperature of 175° C.

In Examples 4 to 13, 15, 18 to 24 and 26 to 28, at least a part of the concentrated layer B according to the present invention is formed inside of at least either a diffusion layer or an intermetallic compound constituted primarily of the major components of the electrode and copper. It has been therefore confirmed that this structure has a high effect of improving the reliability in the severe high-temperature heating test in which the heating temperature is raised to 185° C.

In Examples 3 to 7, 9, 10, 12, 13, 15 to 19, 21 to 25, 27 and 28, the thickness of the region in the concentrated layer A according to the present invention where the concentration of the metal R is 50 mol % or more is not less than three times that of the area in the concentrated layer B where the concentration of the metal R is 50 mol or more. It has been therefore confirmed that this structure enhances the reliability in the reflow test using a sample obtained by connecting a bonding wire at 200° C., which is an ordinary bonding temperature. Preferably, in Examples 3, 5, 6, 9, 10, 12, 13, 15 to 17, 19, 21, 25, 27 and 28, the ratio between the thicknesses of the concentrated layers A and B is five times or more. It has been confirmed that this structure enhances the reliability in the reflow test using a sample obtained by connecting a bonding wire at 160° C. which is a severe bonding temperature.

In Examples 3 to 13, 15 to 17, 21 to 23 and 25 to 28, three concentrated layers, that is, the concentrated layers A, B and C according to the present invention are formed at the same time. It has been therefore confirmed that the reliability is thereby improved even if heating is performed for a time as long as 200 hr in the HAST test.

In Examples 1, 3 to 17, 21 to 23 and 25 to 29, the concentrated A according to the present invention, in which the concentration ratio is 10 or more, is formed at the interface of the bump/wedge bonding part, and the concentrated layer C, in which the concentration of the metal R is not less than five times the average concentration of the metal R in the ball bump, is formed in 40% or more of the area of the surface of the ball bump and in 30% or more of the area of the surface of the bonding wire connected onto the ball bump. It has been therefore confirmed that this structure gives a high reliability in the PCT test.

In Examples 3 to 10, 12 to 17, 21 to 23 and 25 to 29, the concentrated layers A and C according to the present invention are formed wherein the thickness of the region in the concentrated layer A where the concentration of the metal R is 10 mol % or more is in a range from 0.01 to 5 μm. It has been therefore confirmed that this structure improves not only the reliability in the PCT test, but also the continuous bonding ability in reverse bonding using a bonding wire having a wire diameter of 20 μm at a pitch of 65 μm.

In Examples 3 to 10, 12 to 17, 21 to 23, 25, and 27 to 29, the concentrated layers A and C according to the present invention are formed wherein, in the concentrated layer A, the thickness of the region where the concentration of the metal R is 50 mol % or more is in a range from 0.005 to 1 μm. It has been therefore confirmed that this structure improves not only the reliability in the PCT test, but also the continuous bonding ability in reverse bonding using a bonding wire having a wire diameter of 18 μm at a pitch of 50 μm.

In Examples 3 to 10, 12 to 17, 21 to 23 and 26 to 28, the thickness of the region where the concentration of the metal R is 0.5 mol % or more is in a range from 0.05 to 20 μm in the concentrated layer C on the surface of the bump according to the present invention. It has been therefore confirmed that this has a high effect of improving the reliability in heating for a longer time as much as 400 hr in the HAST test.

In Examples 1 to 23 and 26 to 30, it has been confirmed that the second pull strength is improved because the metal R according to the present invention is one or more elements selected from palladium, gold and platinum. Preferably, in Examples 1 to 19 and 26 to 29 in which the metal R includes palladium, it has been confirmed that the ball bump is improved in the roundness of the shape.

In Examples 1 to 12 and 14 to 30, the thickness of the region where oxygen is contained in an amount of 10 mol % or more is in a range from 0 to 0.05 μm within a 1 mm-width region extending above and below the interface of the bonding part between the bonding wire and the ball bump according to the present invention. It has been therefore confirmed that the reliability in the heat cycle test (TCT test) is enhanced. Preferably, in Examples 1 to 11, 14 to 24 and 26 to 30, the thickness of an region where oxygen is contained in an amount of 20 mol % or more is in a range from 0 to 0.03 μm. It has been therefore confirmed that this structure exerts a high effect of further improving the reliability in the TCT test.

In Examples 1 to 28, the bonding wire according to the present invention is made to have a bonding structure using a bonding wire constituted of a core material containing copper as its major component and an outer skin layer which contains a metal R as its major component and covers the core material. It has been therefore confirmed that this structure makes it easy to make an improvement in overall performance by using a current bonding apparatus and wire bonding technologies to, for example, increase the productivity of continuous bonding and to improve the high-temperature reliability.

In Examples 1 to 23 and 26 to 28, a bonding wire according to the present invention is used which is provided with an outer skin layer containing one or more elements selected from palladium, gold and platinum as a metal R which is the major component and a core material containing copper as its major component. It has been therefore confirmed that this structure has the effect of stabilizing the shape of the loop in reverse bonding. Preferably, in Examples 2 to 13, 15 to 19 and 26 to 28, the concentrated layers A and B are formed by reverse bonding connection using a multilayer copper wire constituted of a core material which is coated with an outer skin layer containing palladium as its major component, the core material containing copper as its major component. It has been therefore confirmed that this structure inhibits stripping failures.

In Examples 2 to 8, 10 and 12 to 28, it has been confirmed that the effect of stabilizing the loop shape is further improved because the thickness of the outer skin layer is in a range from 0.002 to 0.8 μm in the bonding wire according to the present invention.

In Examples 4, 8, 12, 15, 17, 21, 23 and 26, it has been confirmed that the linearity of the loop is improved because the core material is any one of the copper alloys 1 to 4 in the bonding wire according to the present invention.

In Example 31 to 37, it has been confirmed that high-speed bonding ability and the life of the capillary are improved because the metal R according to the present invention is comprised of an element consisting of palladium and silver or an element consisting of palladium and gold.

In Examples 38 to 40, on the other hand, the metal R is any one of silver, gold and palladium and therefore, from the fact that the above requirement that the metal R is an element consisting of palladium and silver or an element consisting of palladium and gold is not satisfied, the high-speed bonding ability and the life of the capillary are deteriorated.

In Examples 31 to 37, the concentrated layer A according to the present invention includes an area constituted of any one of an alloy consisting of palladium and silver or an alloy of palladium and gold and an region where the maximum concentration of palladium is 80% or more. It has been therefore confirmed that this structure allows the compatibility of the roundness of the bump shape with an increase in the peeling strength of the bump/wedge bonding part.

DESCRIPTION OF REFERENCE NUMERALS

1: bonding wire
2: bump (stud bump)
3: electrode
4: semiconductor device
a: bonding interface of bump/wedge bonding part
b: bonding interface of electrode/bump bonding part

The invention claimed is:
1. A bonding structure of a bonding wire for wedge-bonding the bonding wire onto a ball bump formed on an electrode of a semiconductor device by bonding a ball part formed at an end of the bonding wire, the bonding wire including a core material containing copper as a major component thereof and an outer skin layer which contains a metal R other than copper as a major component thereof and covers the core material, the bonding structure comprising:
   a concentrated layer A provided in an initial boundary region at a bonding part between the ball bump and the bonding wire, wherein the concentration of the metal R in the concentrated layer A is not less than ten times the average concentration of the metal R in the ball bump; and
   a concentrated layer B provided in an initial boundary region at a bonding part between the ball bump and the electrode, wherein the concentration of the metal R in the concentrated layer B is not less than ten times the average concentration of the metal R in the ball bump,
   wherein the metal R is palladium, or includes two metals consisting of either palladium and silver or palladium and gold,
   in the concentrated layer A, there is a range in which the concentration of the metal R is 10mol% or more in a thickness range from 0.01 to 5um, and in the concentrated layer B, there is a range in which the concentration of the metal R is 3mol% or more in a thickness range from 0.01 to 5um.

2. The bonding structure of the bonding wire according to claim 1, wherein, in the concentrated layer A, the thickness of a region in which the concentration of the metal R is 50 mol % or more is in a range from 0.005 to 1 μm.

3. The bonding structure of the bonding wire according to claim 1, wherein at least a part of the concentrated layer B is formed inside of at least one of a diffusion layer and an intermetallic compound, the diffusion layer and the intermetallic compound being each constituted primarily of major components of the electrode and copper.

4. The bonding structure of the bonding wire according to claim 1, wherein the thickness of a region in which the concentration of the metal R in the concentrated layer A is 50 mol % or more is not less than three times that of a region in which the concentration of the metal R in the concentrated layer B is 50 mol % or more.

5. The bonding structure of the bonding wire according to claim 1, the bonding structure further comprising a concentrated layer C, comprising two portions:
   a first portion formed in 40% or more of a first surface area of the ball bump, which is exposed and without directly connecting to the bonding wire and the electrode; and
   a second portion formed in 30% or more of a second surface area of the bonding wire, which is at an ending portion of the bonding wire and is exposed without directly connecting to the ball bump,
   wherein the concentration of the metal R in the concentrated layer C is not less than five times the average concentration of the metal R in the ball bump, and
   wherein the second surface area of the bonding wire is projected upward.

6. The bonding structure of the bonding wire according to claim 1, wherein the outermost layer of the outer skin layer contains either an alloy of palladium and silver or an alloy of palladium and gold as a major component thereof; and the concentrated layer A includes an alloy region comprised of either an alloy of palladium and silver or an alloy of palladium and gold, and another region containing palladium in a maximum concentration of 80 mol % or more.

7. The bonding structure of the bonding wire according to claim 1, wherein the thickness of a region having an oxygen concentration of 10mol% or more is in a range from 0 to 0.05 μm (excluding 0 μm) extending above and below the initial boundary region of the bonding part between the bonding wire and the ball bump.

8. The bonding structure of the bonding wire according to claim 6, wherein the thickness of the outer skin layer is in a range from 0.002 to 0.8 μm.

9. The bonding structure of the bonding wire according to claim 1, wherein the outer skin layer has a monolayer structure.

10. A bonding structure of a bonding wire for wedge-bonding the bonding wire onto a ball bump formed on an electrode of a semiconductor device by bonding a ball part formed at an end of the bonding wire, the bonding wire including a core material containing copper as a major component thereof and an outer skin layer which contains a metal R other than copper as a major component thereof and covers the core material, the bonding structure comprising:
   a concentrated layer A provided in an initial boundary region at a bonding part between the ball bump and the bonding wire, wherein the concentration of a metal R other than copper in the concentrated layer A is not less than ten times the average concentration of the metal R in the ball bump; and
   a concentrated layer C, comprising two portions:
   a first portion formed in 40% or more of a first surface area of the ball bump, which is exposed and without directly connecting to the bonding wire and the electrode; and
   a second portion formed in 30% or more of a second surface area of the bonding wire, which is at an ending portion of the bonding wire and is exposed without directly connecting to the ball bump,
   wherein the concentration of the metal R in the concentrated layer C is not less than five times the average concentration of the metal R in the ball bump,
   wherein the second surface area of the bonding wire is projected upward, the metal R is palladium, or includes two metals consisting of either palladium and silver or palladium and gold, in the concentrated layer A, there is a range in which the concentration of the metal R is 10mol% or more in a thickness range from 0.01 to 5um, and in the concentrated layer C on the surface of the bump, there is a range in which the concentration of the metal R is 0.5mol% or more in a thickness range from 0.05 to 20μm.

11. The bonding structure of the bonding wire according to claim 10, wherein, in the concentrated layer A, the thickness of a region in which the concentration of the metal R is 50 mol% or more is in a range from 0.005 to 1 μm.

12. The bonding structure of the bonding wire according to claim 10, wherein the outermost layer of the outer skin layer contains either an alloy of palladium and silver or an alloy of palladium and gold as a major component thereof; and the concentrated layer A includes an alloy region comprised of either an alloy of palladium and silver or an alloy of palladium and gold, and another region containing palladium in a maximum concentration of 80 mol% or more.

13. The bonding structure of the bonding wire according to claim 10, wherein the thickness of a region having an oxygen concentration of 10 mol% or more is in a range from 0 to 0.05 μm (excluding 0μm) extending above and below the initial boundary region of the bonding part between the bonding wire and the ball bump.

14. The bonding structure of the bonding wire according to claim 12, wherein the thickness of the outer skin layer is in a range from 0.002 to 0.8 μm.

15. The bonding structure of the bonding wire according to claim 10, wherein the outer skin layer has a monolayer structure.

* * * * *